(12) United States Patent
Tanaka

(10) Patent No.: US 11,262,377 B2
(45) Date of Patent: Mar. 1, 2022

(54) INERTIAL SENSOR, ELECTRONIC APPARATUS, AND VEHICLE

(71) Applicant: Seiko Epson Corporation, Tokyo (JP)

(72) Inventor: Satoru Tanaka, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/941,797

(22) Filed: Jul. 29, 2020

(65) Prior Publication Data
US 2021/0033639 A1 Feb. 4, 2021

(30) Foreign Application Priority Data
Jul. 30, 2019 (JP) .............................. JP2019-139498

(51) Int. Cl.
*G01P 15/08* (2006.01)
*G01P 15/125* (2006.01)
*H01G 5/16* (2006.01)

(52) U.S. Cl.
CPC ........ *G01P 15/125* (2013.01); *G01P 15/0802* (2013.01); *H01G 5/16* (2013.01)

(58) Field of Classification Search
CPC .... G01P 15/125; G01P 15/18; G01P 15/0802; G01P 15/0831; H01G 5/16; B81B 3/001; B81B 2201/025
See application file for complete search history.

(56) References Cited

U.S. PATENT DOCUMENTS

| 5,581,035 A * | 12/1996 | Greiff .................. G01P 15/0802 324/688 |
| 6,955,086 B2 * | 10/2005 | Yoshikawa ........... G01P 15/125 73/514.29 |
| 7,121,141 B2 | 10/2006 | McNeil |
| 7,721,604 B2 * | 5/2010 | Pruetz .................... G01P 15/125 73/514.32 |
| 9,880,192 B2 | 1/2018 | Cheng et al. |
| 2004/0160232 A1 * | 8/2004 | Yue ........................ G01P 15/131 324/660 |
| 2006/0169043 A1 | 8/2006 | McNeil |
| 2008/0173091 A1 * | 7/2008 | McNeil ................. G01P 15/125 73/514.32 |

(Continued)

FOREIGN PATENT DOCUMENTS

JP 2008-529001 A 7/2008
JP 2010-026162 A 2/2010
(Continued)

*Primary Examiner* — David J Bolduc
(74) *Attorney, Agent, or Firm* — Harness, Dickey & Pierce, P.L.C.

(57) ABSTRACT

An inertial sensor includes: a substrate; a moving element swinging about a swing axis along a Y-axis; a detection electrode provided at the substrate, overlapping the moving element as viewed in a plan view from a Z-axis direction orthogonal to the Y-axis, and forming an electrostatic capacitance with the moving element; an exposure part provided at an inner side of the detection electrode and exposing a surface facing the moving element, of the substrate; a protrusion overlapping the moving element as viewed in a plan view from the Z-axis direction and protruding toward the moving element from the exposure part of the substrate; and a covered electrode provided at a top of the protrusion and having a same electric potential as the moving element.

9 Claims, 24 Drawing Sheets

(56) References Cited

U.S. PATENT DOCUMENTS

| | | | | |
|---|---|---|---|---|
| 2011/0056297 A1* | 3/2011 | Classen | | G01P 15/125 |
| | | | | 73/514.32 |
| 2011/0188104 A1 | 8/2011 | Tachibana et al. | | |
| 2013/0192370 A1* | 8/2013 | Yoda | | G01P 15/125 |
| | | | | 73/514.01 |
| 2014/0137670 A1* | 5/2014 | Hata | | G01P 15/125 |
| | | | | 73/862.621 |
| 2014/0338451 A1 | 11/2014 | Takagi | | |
| 2015/0040667 A1* | 2/2015 | Tanaka | | G01P 15/125 |
| | | | | 73/514.32 |
| 2016/0047839 A1* | 2/2016 | Tanaka | | G01P 15/125 |
| | | | | 73/514.32 |
| 2016/0061858 A1* | 3/2016 | Tanaka | | G01P 15/131 |
| | | | | 73/514.18 |
| 2017/0023606 A1* | 1/2017 | Naumann | | B81B 7/0016 |
| 2017/0082653 A1* | 3/2017 | Komizo | | G01P 15/125 |
| 2017/0088413 A1* | 3/2017 | Tanaka | | B81B 3/001 |
| 2018/0273375 A1* | 9/2018 | Tanaka | | B81C 1/00166 |
| 2018/0275162 A1* | 9/2018 | Tanaka | | G01C 21/005 |
| 2018/0275163 A1* | 9/2018 | Tanaka | | G01P 15/125 |
| 2018/0372773 A1* | 12/2018 | Matsuura | | G01P 15/125 |
| 2019/0025338 A1* | 1/2019 | Matsuura | | H01L 29/84 |
| 2019/0062149 A1* | 2/2019 | Tanaka | | B81B 3/0072 |
| 2019/0063924 A1* | 2/2019 | Tanaka | | G01P 15/125 |
| 2019/0064202 A1* | 2/2019 | Tanaka | | G01C 19/5705 |
| 2019/0064206 A1* | 2/2019 | Tanaka | | G01P 15/125 |
| 2019/0234990 A1* | 8/2019 | Kihara | | B81B 3/0051 |
| 2019/0234991 A1* | 8/2019 | Kihara | | G01P 15/125 |
| 2020/0039814 A1* | 2/2020 | Tanaka | | B60W 30/02 |

FOREIGN PATENT DOCUMENTS

| | | |
|---|---|---|
| JP | 2013-024765 A | 2/2013 |
| JP | 2014-224739 A | 12/2014 |

* cited by examiner

INERTIAL SENSOR, ELECTRONIC APPARATUS, AND VEHICLE

The present application is based on, and claims priority from JP Application Serial Number 2019-139498, filed Jul. 30, 2019, the disclosure of which is hereby incorporated by reference herein in its entirety.

BACKGROUND

1. Technical Field

The present disclosure relates to an inertial sensor, an electronic apparatus, and a vehicle.

2. Related Art

Inertial sensors described in JP-A-2014-224739 and JP-T-2008-529001 are respectively sensors that can detect an acceleration in a Z-axis direction and have a substrate, a moving element seesawing about a swing axis along a Y-axis direction in relation to the substrate, and a detection electrode provided at the substrate. The moving element has a first moving part and a second moving part provided on both sides of the swing axis and having different moments of rotation from each other about the swing axis. The detection electrode has a first detection electrode arranged at the substrate, facing the first moving part, and a second detection electrode arranged at the substrate, facing the second moving part.

When an acceleration in the Z-axis direction is applied to the inertial sensor of such a configuration, the moving element seesaws about the swing axis and this causes the electrostatic capacitance between the first moving part and the first detection electrode and the electrostatic capacitance between the second moving part and the second detection electrode to change in the opposite phases. Therefore, the acceleration in the Z-axis direction can be detected, based on the change in the electrostatic capacitance.

The inertial sensor described in JP-A-2014-224739 has a protrusion-like stopper provided at the substrate and configured to come into contact with the moving element when the moving element seesaws excessively and thus to regulate further displacement of the moving element. Meanwhile, the inertial sensor described in JP-T-2008-529001 has a protrusion-like stopper provided at the moving element and configured to come into contact with the substrate when the moving element seesaws excessively and thus to regulate further displacement of the moving element.

However, in the inertial sensor of JP-A-2014-224739, the stopper is covered with the first and second detection electrodes having a different electric potential from the moving element. Therefore, an electrostatic attraction occurs between the moving element and the stopper. This electrostatic attraction tends to cause a so-called "sticking", the phenomenon of the moving element becoming stuck to the substrate. Meanwhile, in the inertial sensor of the JP-T-2008-529001, a dummy electrode having the same electric potential as the moving element is arranged at a site on the substrate that comes into contact with the stopper, and this restrains the occurrence of the sticking, which poses a problem in JP-A-2014-224739. However, in the inertial sensor of JP-T-2008-529001, the area of the detection electrode must be reduced by an amount corresponding to the dummy electrode and the acceleration detection sensitivity drops accordingly. That is, the inertial sensors of JP-A-2014-224739 and JP-T-2008-529001 have a problem in that an inertial sensor having a high sensitivity while restraining the sticking cannot be provided.

SUMMARY

An inertial sensor according to an aspect of the present disclosure includes: a substrate; a moving element swinging about a swing axis along a Y-axis; a detection electrode provided at the substrate, overlapping the moving element as viewed in a plan view from a Z-axis direction orthogonal to the Y-axis, and forming an electrostatic capacitance with the moving element; an exposure part provided at an inner side of the detection electrode as viewed in a plan view from the Z-axis direction and exposing a surface facing the moving element, of the substrate; a protrusion overlapping the moving element as viewed in a plan view from the Z-axis direction and protruding toward the moving element from the exposure part of the substrate; and a covered electrode provided at a top of the protrusion and having a same electric potential as the moving element.

DESCRIPTION OF EXEMPLARY EMBODIMENTS

The inertial sensor, the electronic apparatus, and the vehicle according to the present disclosure will now be described in detail, based on embodiments illustrated in the accompanying drawings.

First Embodiment

Figure 1:
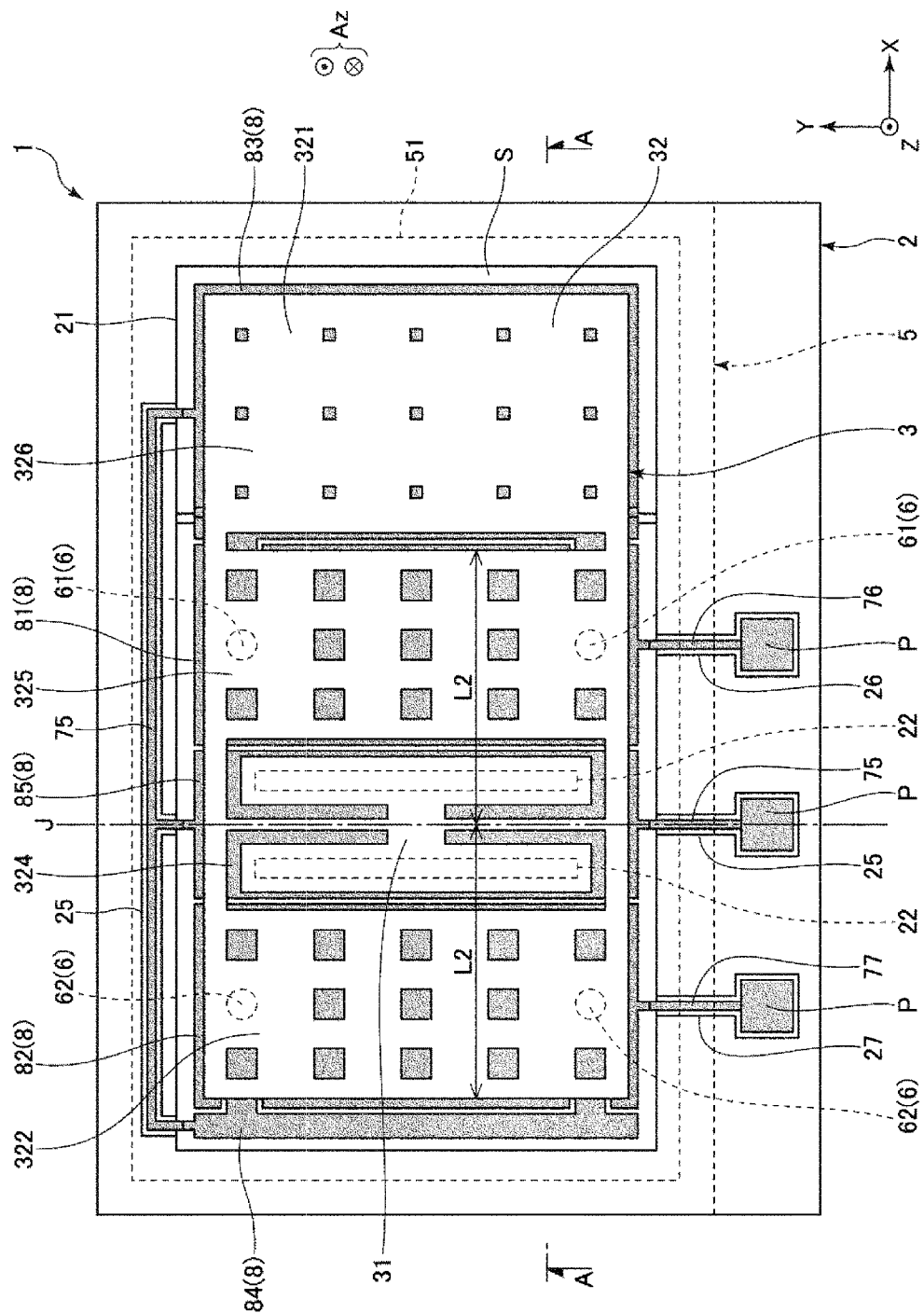
FIG. 1 is a plan view showing an inertial sensor according to a first embodiment.
Figure 2:
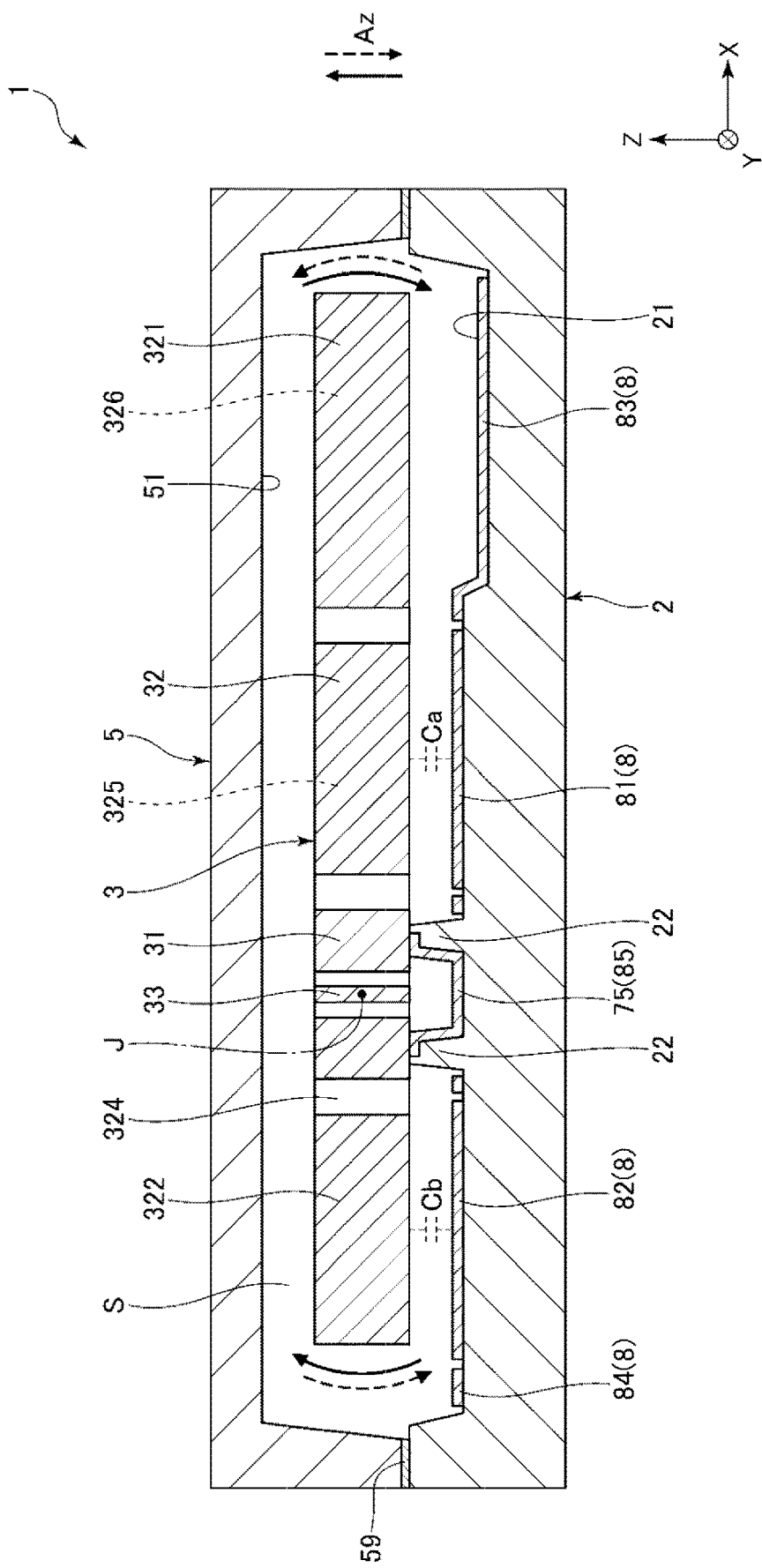
FIG. 2 is a cross-sectional view taken along A-A in FIG. 1.
Figure 3:
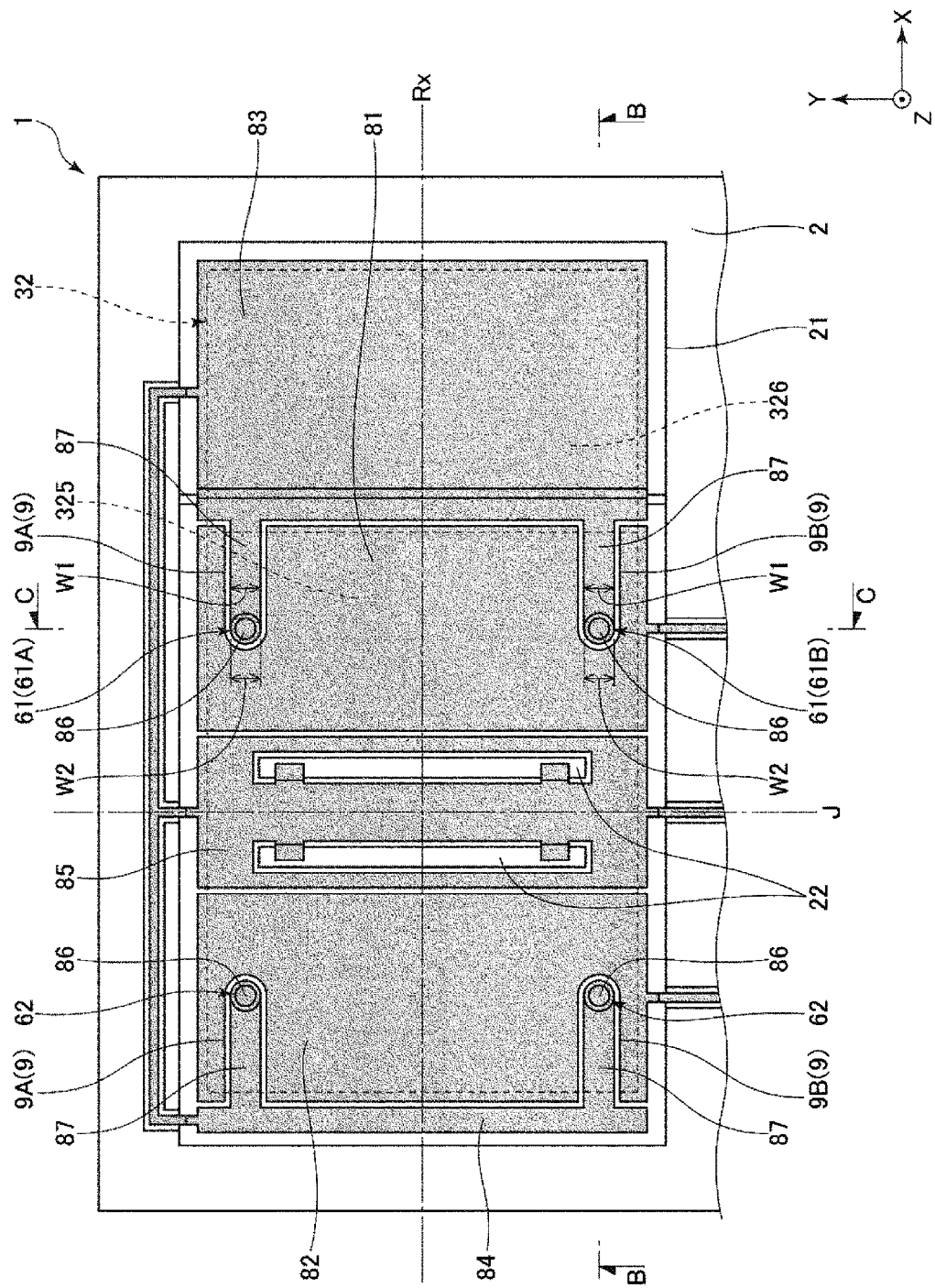
FIG. 3 is a plan view of a substrate provided in the inertial sensor.
Figure 4:
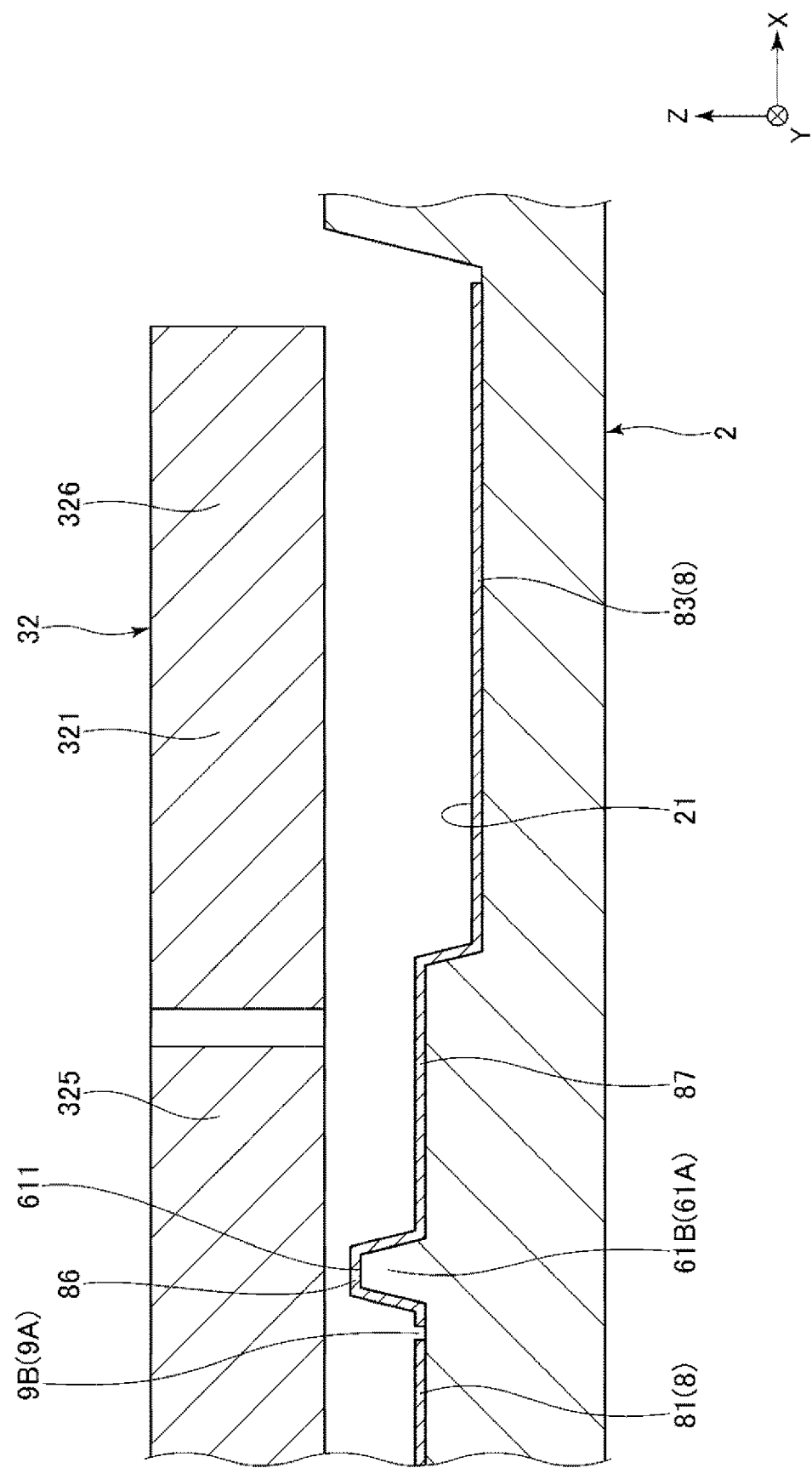
FIG. 4 is a cross-sectional view taken along B-B in FIG. 3.
Figure 5:
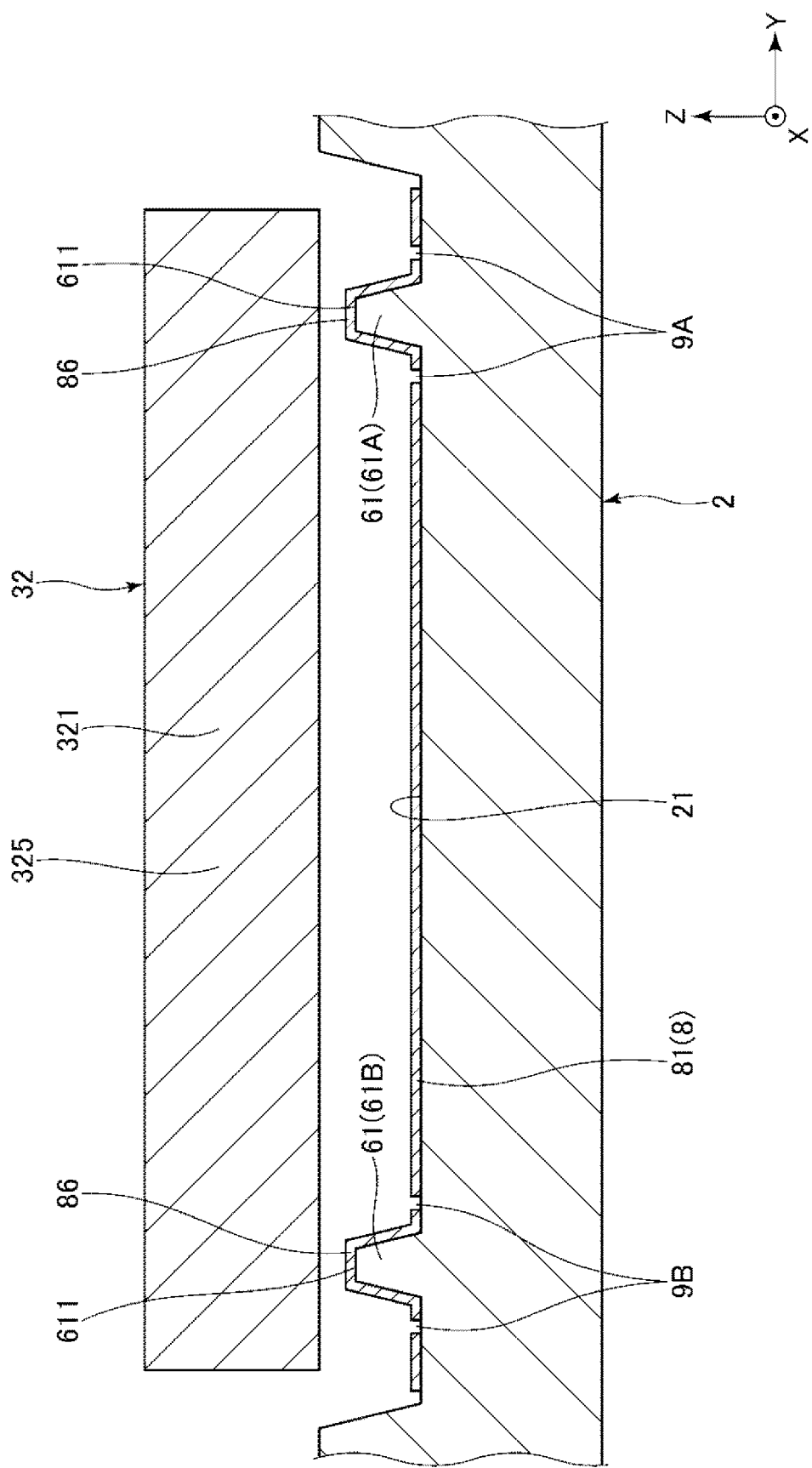
FIG. 5 is a cross-sectional view taken along C-C in FIG. 3.
Figure 6:
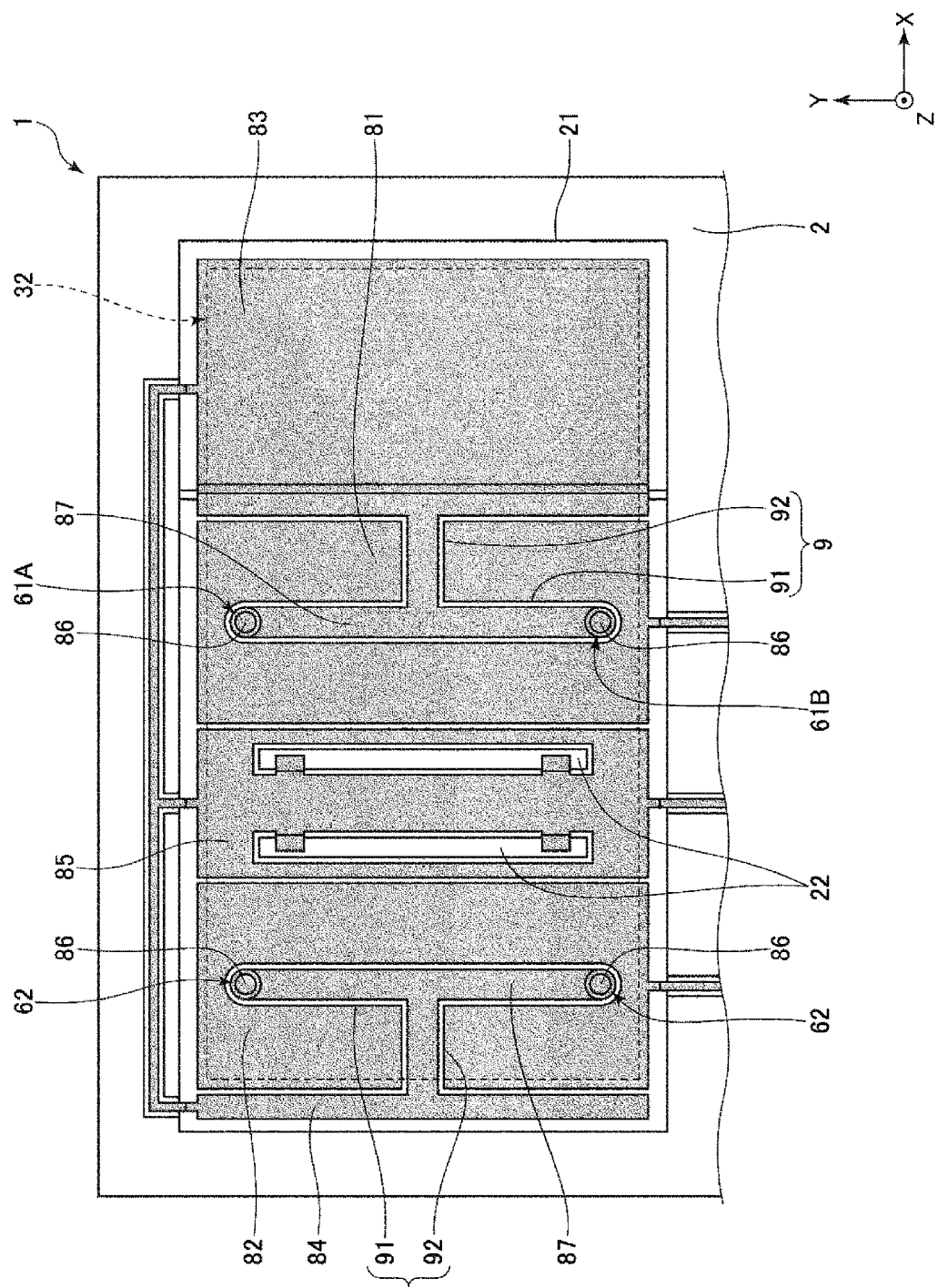
FIG. 6 is a plan view showing a modification example.
Figure 7:
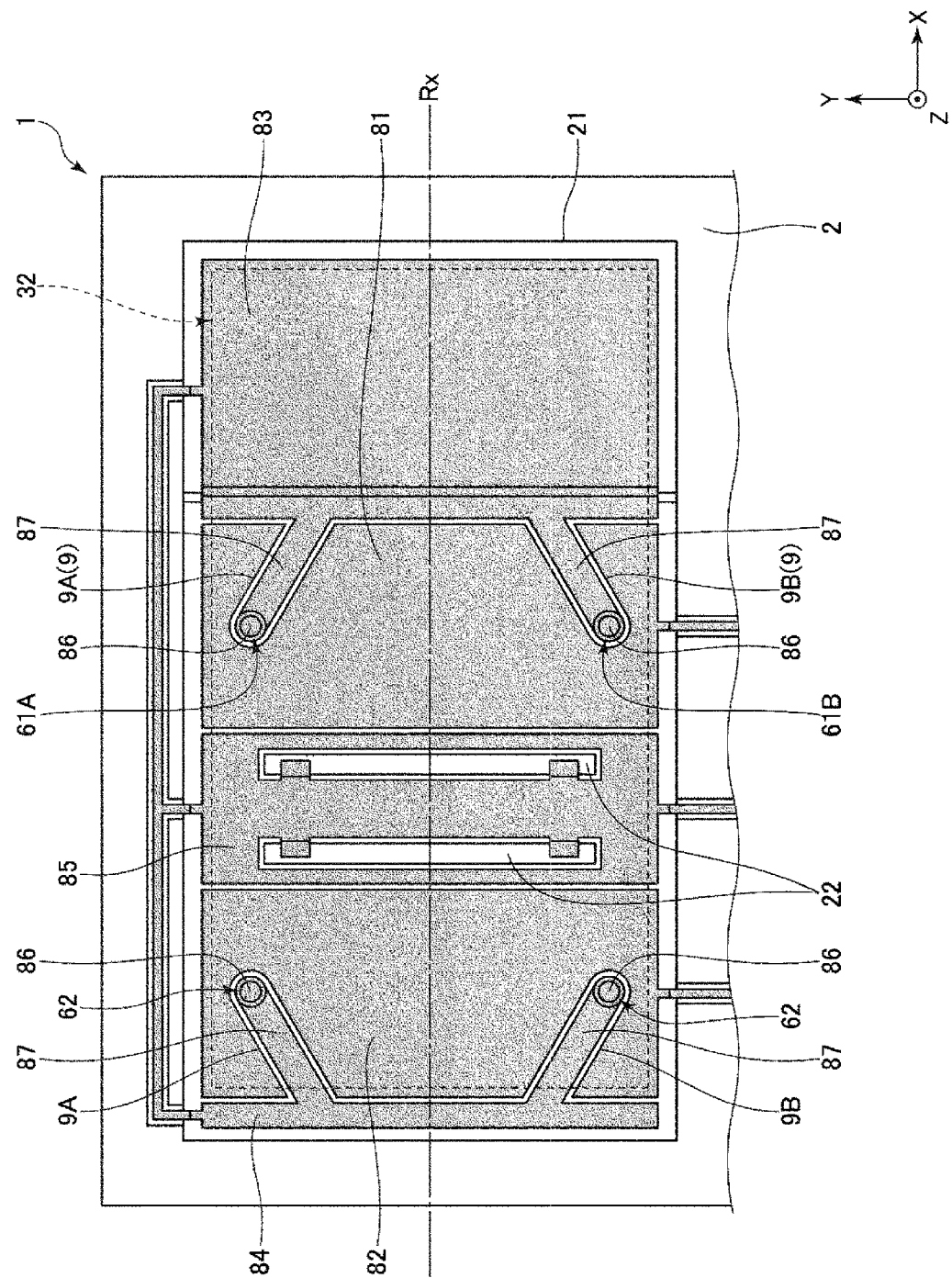
FIG. 7 is a plan view showing a modification example.

FIG. 1 is a plan view showing an inertial sensor according to a first embodiment. FIG. 2 is a cross-sectional view taken along A-A in FIG. 1. FIG. 3 is a plan view of a substrate provided in the inertial sensor. FIG. 4 is a cross-sectional view taken along B-B in FIG. 3. FIG. 5 is a cross-sectional view taken along C-C in FIG. 3. FIGS. 6 and 7 are plan views showing a modification example.

In the description below, for the sake of convenience of the description, an X-axis, a Y-axis, and a Z-axis are employed as three axes orthogonal to each other. A direction along the X-axis, that is, a direction parallel to the X-axis, is referred to as an "X-axis direction". A direction along the Y-axis, that is, a direction parallel to the Y-axis, is referred to as a "Y-axis direction". A direction along the Z-axis, that is, a direction parallel to the Z-axis, is referred to as a "Z-axis direction". The tip side of the arrow on each axis is referred to as a "positive side". The opposite side is referred to as a "negative side". The positive side of the Z-axis direction is referred to as "up". The negative side of the Z-axis direction is referred to as "down". In this specification, the meaning of the term "orthogonal" includes what can be seen as orthogonal in a technically practical sense, specifically, the state of intersecting at 90° and also the state of intersecting at an angle slightly off 90°, for example, within a range of approximately 90°±5°. Similarly, the meaning of the term "parallel" includes what can be seen as parallel in a technically practical sense, specifically, the case where the angle formed by two things is 0° and also the case where the angle formed by two things is within a range of approximately 0°±5°.

An inertial sensor 1 shown in FIG. 1 is an acceleration sensor detecting an acceleration Az in the Z-axis direction. The inertial sensor 1 has a substrate 2, a sensor element 3 arranged at the top of the substrate 2, and a lid 5 bonded to the substrate 2 and covering the sensor element 3.

As shown in FIG. 1, the substrate 2 has an expanse in the X-axis direction and the Y-axis direction and has a thickness in the Z-axis direction. As shown in FIG. 2, the substrate 2 has a recess 21 open to an upper surface side. As viewed in a plan view from the Z-axis direction, the recess 21 contains the sensor element 3 inside and is formed to be larger than the sensor element 3. The recess 21 functions as a clearance part that restrains contact between the sensor element 3 and the substrate 2. The substrate 2 also has amount 22 protruding toward the sensor element 3 from a bottom surface of the recess 21. The sensor element 3 is boned to an upper surface of the mount 22. The substrate 2 also has grooves 25, 26, 27 open on its upper surface.

As the substrate 2, a glass substrate formed of, for example, a glass material containing an alkali metal ion, which is a mobile ion, such as Na$^+$, for example, a borosilicate glass such as Pyrex glass or Tempax glass (both being registered trademarks), can be used. However, the substrate 2 is not particularly limited and may be, for example, a silicon substrate or ceramic substrate.

As shown in FIG. 1, an electrode 8 is provided at the substrate 2. The electrode 8 is arranged at the bottom surface of the recess 21 and has a first detection electrode 81, a second detection electrode 82, a first dummy electrode 83, and a second dummy electrode 84 that overlap the sensor element 3 as viewed in a plan view. The substrate 2 also has wirings 75, 76, 77 arranged in the grooves 25, 26, 27.

One end of each of the wirings 75, 76, 77 is exposed outside and functions as an electrode pad P for electrical coupling to an external device. The wiring 75 is electrically coupled to the sensor element 3 and the first and second dummy electrodes 83, 84. That is, the first and second dummy electrodes 83, 84 have the same electric potential as a moving element 32 of the sensor element 3, described later. The wiring 75 spreads as broadly as possible between the first detection electrode 81 and the second detection electrode 82 and has a function similar to that of the first and second dummy electrodes 83, 84. Therefore, in the description below, the part of the wiring 75 spreading over the bottom surface of the recess 21 is also referred to as a "third dummy electrode 85". The wiring 76 is electrically coupled to the first detection electrode 81. The wiring 77 is electrically coupled to the second detection electrode 82.

As shown in FIG. 2, the lid 5 has a recess 51 open to a lower surface side. The lid 5 is bonded to the upper surface of the substrate 2, with the recess 51 accommodating the sensor element 3 inside. The lid 5 and the substrate 2 together form an accommodation space S accommodating the sensor element 3 inside. The accommodation space S is an airtight space filled with an inert gas such as nitrogen, helium or argon and preferably has a substantially barometric pressure at operating temperatures (approximately −40° C. to 125°). However, the atmosphere in the accommodation space S is not particularly limited and may be, for example, a pressure-reduced state or a pressurized state.

As the lid 5, for example, a silicon substrate can be used. However, the lid 5 is not particularly limited to this and may be, for example, a glass substrate or ceramic substrate. The method for bonding the substrate 2 and the lid 5 is not particularly limited, either. A suitable method may be selected according to the materials of the substrate 2 and the lid 5. For example, anodic bonding, activated bonding in which bonding surfaces activated by plasma irradiation are bonded together, bonding with a bonding material such as a glass frit, diffusion bonding in which metal films formed at the upper surface of the substrate 2 and the lower surface of the lid 5 are bonded together, or the like, can be used. In this embodiment, the substrate 2 and the lid 5 are bonded together with a glass frit 59 formed of a low-melting-point glass.

The sensor element 3 is formed, for example, by patterning an electrically conductive silicon substrate doped with an impurity such as phosphorus (P), boron (B), or arsenic (As), by etching, particularly, by the Bosch process, which is a deep trench etching technique. The sensor element 3 has an H-shaped fixed part 31 bonded to the upper surface of the mount 22, a moving element 32 that can swing about a swing axis J along the Y-axis in relation to the fixed part 31, and a swing beam 33 coupling the fixed part 31 and the moving element 32 together, as shown in FIG. 1. The mount 22 and the fixed part 31 are, for example, anodically bonded together.

The moving element 32 has a rectangular shape with its longitudinal direction laid along the X-axis direction, as viewed in a plan view from the Z-axis direction. The moving element 32 has a first moving part 321 and a second moving part 322 arranged on both sides of the swing axis J along the Y-axis, as viewed in a plan view from the Z-axis direction. The first moving part 321 is located on the positive side of the X-axis direction in relation to the swing axis J. The second moving part 322 is located on the negative side of the X-axis direction in relation to the swing axis J. The first moving part 321 is longer in the X-axis direction than the second moving part 322 and has a greater moment of rotation about the swing axis J than the second moving part 322 when the acceleration Az is applied.

The first moving part 321 has a symmetric part 325 forming symmetry with the second moving part 322 about the swing axis J, and an asymmetric part 326 located further away from the swing axis J than the symmetric part 325 and forming asymmetry with the second moving part 322 about the swing axis J, as viewed in a plan view from the Z-axis direction. When the length of the second moving part 322 from the swing axis J is L2, a part of the first moving part 321 at a distance equal to the length L2 from the swing axis J is the boundary between the symmetric part 325 and the asymmetric part 326. The portion on the swing axis J side from this part is the symmetric part 325. The portion on the side opposite to the swing axis J is the asymmetric part 326. The asymmetric part 326 functions as a torque generation part to make the moment of rotation about the swing axis J of the first moving part 321 greater than the moment of rotation about the swing axis J of the second moving part 322.

This difference in the moment of rotation causes the moving element 32 to seesaw about the swing axis J when the acceleration Az is applied. The seesawing means that the second moving part 322 is displaced to the negative side of the Z-axis direction when the first moving part 321 is displaced to the positive side of the Z-axis direction, whereas the second moving part 322 is displaced to the positive side of the Z-axis direction when the first moving part 321 is displaced to the negative side of the Z-axis direction.

The moving element 32 also has an opening 324 located between the first moving part 321 and the second moving part 322. The fixed part 31 and the swing beam 33 are arranged inside the opening 324. Arranging the fixed part 31 and the swing beam 33 on the inner side of the moving element 32 in this way can achieve miniaturization of the sensor element 3. The moving element 32 also has a plurality of penetration holes formed evenly over its entire area. This can reduce damping due to viscosity. However, the penetration holes may be omitted or may be arranged unevenly.

Back to the description of the electrode 8 arranged at the bottom surface of the recess 21, the first detection electrode 81 is arranged overlapping the symmetric part 325, which is a proximal end part of the first moving part 321, and the second detection electrode 82 is arranged overlapping the second moving part 322, as viewed in a plan view from the Z-axis direction, as shown in FIGS. 1 and 2. The first and second detection electrodes 81, 82 are provided substantially symmetrically about the swing axis J, as viewed in a plan view from the Z-axis direction, so that electrostatic capacitances Ca, Cb, described later, are equal to each other in a natural state where the acceleration Az is not applied.

The first dummy electrode 83 is located further to the positive side of the X-axis direction than the first detection electrode 81 and is provided overlapping the asymmetric part 326, which is a distal end part of the first moving part 321. Such a first dummy electrode 83 prevents the bottom surface of the recess 21 from being exposed in an area overlapping the asymmetric part 326. Since the bottom surface of the recess 21 is thus covered by the first dummy electrode 83, the bottom surface of the recess 21 can be restrained from being charged due to the migration of alkali metal ions in the substrate 2. Therefore, an unintended electrostatic attraction that may lead to the malfunction of the moving element 32 can be effectively restrained from occurring between the bottom surface of the recess 21 and the first moving part 321. Thus, the inertial sensor 1 can detect the acceleration Az more accurately. Meanwhile, the second dummy electrode 84 is located further to the negative side of the X-axis direction than the second detection electrode 82 and is provided without overlapping the second moving part 322.

Although not illustrated, to drive the inertial sensor 1, a drive voltage is applied to the sensor element 3 via the wiring 75, the first detection electrode 81 and a QV amplifier are coupled together via the wiring 76, and the second detection electrode 82 and another QV amplifier are coupled together via the wiring 77. Thus, an electrostatic capacitance Ca is formed between the first moving part 321 and the first detection electrode 81, and an electrostatic capacitance Cb is formed between the second moving part 322 and the second detection electrode 82. The electrostatic capacitances Ca, Cb are substantially equal to each other in a natural state where the acceleration Az is not applied.

When the acceleration Az is applied to the inertial sensor 1, the moving element 32 seesaws about the swing axis J. This seesawing of the moving element 32 causes the gap between the first moving part 321 and the first detection electrode 81 and the gap between the second moving part 322 and the second detection electrode 82 to change in the opposite phases. The electrostatic capacitances Ca, Cb change in the opposite phases accordingly. Thus, the inertial sensor 1 can detect the acceleration Az, based on the change in the electrostatic capacitances Ca, Cb.

As shown in FIG. 1, the inertial sensor 1 has a protrusion 6 protruding toward the moving element 32 from the bottom surface of the recess 21 in the substrate 2. In this embodiment, a plurality of protrusions 6 are provided, each being integrated with the substrate 2.

The protrusion 6 functions as a stopper that comes into contact with the moving element 32 when the moving element 32 seesaws excessively, and thus regulates further seesawing of the moving element 32. Providing such a protrusion 6 can restrain excessive approach or contact over a broad area, between the moving element 32 and the first and second detection electrodes 81, 82 having different electric potentials from each other. This can effectively restrain the occurrence of the "sticking" of the moving element 32 being left attracted to the first and second detection electrodes 81, 82 due to the electrostatic attraction between the moving element 32 and the first and second detection electrodes 81, 82.

The protrusion 6 has a protrusion 61 provided overlapping the first moving part 321, and a protrusion 62 provided overlapping the second moving part 322, as viewed in a plan view from the Z-axis direction. Of these, the protrusion 61 has the function of restraining excessive approach between the moving element 32 and the first detection electrode 81, and the protrusion 62 has the function of retraining excessive approach between the moving element 32 and the second detection electrode 82. The protrusions 61, 62 have similar configurations to each other and are provided substantially symmetrically about the swing axis J, as viewed in a plan view from the Z-axis direction. Therefore, in the description below, the protrusion 61 is described as a representative example and the description of the protrusion 62 is omitted for the sake of convenience of the description.

As shown in FIG. 3, a plurality of protrusions 61 are provided, spaced apart from each other along the Y-axis direction parallel to the swing axis J, as viewed in a plan view from the Z-axis direction. Particularly in this embodiment, a pair of protrusions 61 are provided. Specifically, when a straight line intersecting the center of the moving element 32 and extending along the X-axis direction, as viewed in a plan view from the Z-axis direction, is defined as an imaginary straight line Rx, one protrusion 61 is provided further to the positive side of the Y-axis direction than the imaginary straight line Rx, and the other protrusion 61 is provided further to the negative side of the Y-axis direction than the imaginary straight line Rx. Thus, when the first moving part 321 comes into contact with each protrusion 61, unwanted displacement of the moving element 32 about the X-axis is less likely to occur. In the description below, the one protrusion 61 is also referred to as 61A, and the other protrusion 61 is also referred to as 61B.

Particularly in this embodiment, the protrusion 61A is provided overlapping an end of the first moving part 321 on the positive side of the Y-axis, and the protrusion 61B is provided overlapping an end of the first moving part 321 on the negative side of the Y-axis. Thus, a long distance can be provided between the protrusions 61A, 61B. This can more effectively restrain unwanted displacement of the moving element 32 about the X-axis as described above.

However, the shape, number, and arrangement of the protrusions 61 is not particularly limited. For example, three or more protrusions 61 having the shape of a truncated cone as in this embodiment may be provided along the Y-axis direction. Also, only one protrusion 61 having the shape of a truncated cone as in this embodiment or only one protrusion 61 having an elongated shape extending in the Y-axis direction may be provided overlapping the imaginary straight line Rx. The planar shape of the protrusion 61 is not particularly limited and may be, for example, a quadrilateral or any other polygon, semicircle, ellipse, or elongated shape extending in the X-axis direction or the Y-axis direction.

The protrusions 61A, 61B are provided overlapping the symmetric part 325 of the first moving part 321 in a plan view from the Z-axis direction. When the moving element 32 seesaws excessively, the symmetric part 325 comes into contact with the protrusions 61A, 61B. In such a configuration, the protrusions 61A, 61B can be provided as closely to the swing axis J as possible. Thus, when the first moving part 321 comes into contact with the protrusions 61A, 61B, the impact of the contact causes the first moving part 321 to flex in such a way that its distal end part is displaced downward, and a compression force in the X-axis direction is applied to a lower surface of the first moving part 321. This can effectively restrain a tensile force in the X-axis direction, which is the opposite force, from being applied to the lower surface of the first moving part 321.

The lower surface of the first moving part 321 tends to become rough and have a very small unevenness when the silicon substrate is patterned by the Bosch process. This is because, during the Bosch process, the surface of the substrate 2 is positively charged due to the migration of alkali metal ions and positive ions penetrating and becoming incident on the silicon substrate etch the lower surface (back side) of the silicon substrate due to electrostatic deflection.

When, for example, the protrusions 61A, 61B are provided overlapping the distal end part of the first moving part 321, a portion from the mount 22 to the protrusions 61A, 61B, of the first moving part 321, may flex to the negative side of the Z-axis direction, and a portion on the distal end side from the protrusions 61A, 61B, of the first moving part 321, may flex to the positive side of the Z-axis direction, due to the impact of coming into contact with the protrusions 61A, 61B. In this case, a tensile stress is applied to the lower surface of the first moving part 321 and may generate a crack starting at the very small unevenness formed on the lower surface of the first moving part 321. Thus, arranging the protrusions 61A, 61B sufficiently near the root of the first moving part 321 so that a compressive force is applied to the lower surface of the first moving part 321, as in this embodiment, suitably restrains the generation of a crack in the first moving part 321 and provides the inertial sensor 1 with high mechanical strength.

However, the arrangement of the protrusions 61A, 61B is not particularly limited. For example, the protrusions 61A, 61B may be provided overlapping the asymmetric part 326.

On the inner side of the first detection electrode 81, as viewed in a plan view from the Z-axis direction, an exposure part 9 where the bottom surface of the recess 21 is exposed is provided, taking up a part of the first detection electrode 81. A pair of exposure parts 9 corresponding to the protrusions 61A, 61B are provided. In the description below, one is referred to as an exposure part 9A and the other is referred to as an exposure part 9B. The protrusion 61A is provided at the exposure part 9A. The protrusion 61B is provided at the exposure part 9B. That is, the protrusions 61A, 61B are provided protruding toward the moving element 32 from the bottom surface of the recess 21 exposed from the exposure parts 9A, 9B. Providing the protrusions 61A, 61B not covered with the first detection electrode 81 in the form of islets in the first detection electrode 81 in this way can restrain the reduction in the area of the first detection electrode 81 due to the provision of the protrusions 61A, 61B. Therefore, even when the protrusion 61 is provided, a sufficiently large electrostatic capacitance Ca can be secured and a high detection sensitivity to the acceleration Az can be achieved.

As shown in FIGS. 4 and 5, a covered electrode 86 electrically insulated from the first detection electrode 81 is provided at atop 611, which is a contact part with the moving element 32, of the protrusions 61A, 61B. Particularly in this embodiment, the covered electrode 86 is provided covering the entire surface of the protrusions 61A, 61B and thus preventing exposure of the surface of the protrusions 61A, 61B. Covering the protrusions 61A, 61B with an electrode in this way can restrain the surface of each of the protrusions 61A, 61B from being charged due to the migration of alkali metal ions in the substrate 2. Therefore, the occurrence of an unintended electrostatic attraction that may lead to the malfunction of the moving element 32 between the protrusions 61A, 61B and the first moving part 321, particularly, displacement due to an external force other than the acceleration Az, which is a detection target, can be effectively restrained. Thus, the inertial sensor 1 can detect the acceleration Az more accurately. The covered electrode 86 may be provided at least at the top 611 of the protrusions 61A, 61B, more specifically, the contact part with the moving element 32. A part of the protrusions 61A, 61B may be exposed out of the covered electrode 86.

As shown in FIG. 3, the exposure parts 9A, 9B are in the shape of a cut-out open to an outer edge of the first detection electrode 81. Inside the exposure parts 9A, 9B, a coupling wiring 87 coupling the covered electrode 86 and the first dummy electrode 83 together in a state electrically insulated from the first detection electrode 81 is provided. That is, the covered electrodes 86 covering the protrusions 61A, 61B are respectively electrically coupled to the first dummy electrode 83 via the coupling wiring 87. As described above, the first dummy electrode 83 has the same electric potential as the moving element 32. Therefore, as a matter of source, each covered electrode 86 coupled to the first dummy electrode 83 has the same electric potential as the moving element 32.

Covering the protrusions 61A, 61B with the covered electrode 86 having the same electric potential as the moving element 32 in this way causes the first moving part 321 and the protrusions 61A, 61B to have the same electric potential. Therefore, practically, an electrostatic attraction is not generated between these. This can effectively restrain the malfunction of the moving element 32 and the sticking of the moving element 32.

Particularly in this embodiment, the exposure parts 9A, 9B extend linearly from the protrusions 61A, 61B to the positive side of the X-axis and open to the outer edge of the first detection electrode 81 on the positive side of the X-axis, that is, at the outer edge at the first dummy electrode 83 side. Thus, the exposure parts 9A, 9B are provided in such a way as to eliminate the first detection electrode 81 located between the covered electrode 86 and the first dummy electrode 83. This makes it easier to lay out the coupling wiring 87 and electrically couple the first dummy electrode 83 and the covered electrode 86 together via the coupling wiring 87. Also, the forming area of the exposure parts 9A, 9B can be made small and the reduction in the area of the first detection electrode 81 due to the provision of the exposure parts 9A, 9B can be effectively restrained.

The configuration of the exposure part 9 is not particularly limited. For example, one exposure part 9 may bifurcate in a T-shape, and the protrusion 61A may be provided at an end of one of bifurcated parts and the protrusion 61B may be provided at an end of the other, as shown in FIG. 6. In other words, the exposure part 9 may have a first part 91 extending in the Y-axis direction and having the protrusion 61A provided at its one end and the protrusion 61B provided at its other end, and a second part 92 extending in the X-axis direction and coupling the first part 91 and the outer edge at the positive side of the X-axis direction, of the first detection electrode 81. Also, each of the exposure parts 9, 9B may extend in a direction tilted from both the X-axis and the Y-axis, as viewed in a plan view from the Z-axis direction, as shown in FIG. 7. In this case, it is preferable that the exposure parts 9A, 9B are symmetric about the imaginary straight line Rx.

As shown in FIG. 3, the coupling wiring 87 has a width W1, that is, a length in the Y-axis direction, which is substantially constant over the entire area in the direction of extension. The width W1 is equal to a width W2 of the covered electrode 86, that is, its length in the Y-axis direction. This makes the width W1 of the coupling wiring 87 appropriate, and can restrain the breaking of the coupling wiring 87 due to an excessively small width W1 and can also restrain an excessive reduction in the area of the first detection electrode 81 due to an excessively large width W1. The meaning of the width W1 being equal to the width W2 includes not only the case where the widths W1, W2 are identical with each other but also the case where there is a possible technical error such as a manufacturing variation, for example, a margin of error of approximately ±5% or less.

The inertial sensor 1 has been described above. Such an inertial sensor 1 has: the substrate 2; the moving element 32 swinging about the swing axis J along the Y-axis; the first detection electrode 81 as a detection electrode provided at the substrate 2, overlapping the moving element 32 as viewed in a plan view from the Z-axis direction orthogonal to the Y-axis, and forming an electrostatic capacitance with the moving element 32; the exposure parts 9A, 9B provided on the inner side of the first detection electrode 81 as viewed in a plan view from the Z-axis direction and exposing the surface on the moving element 32 side of the substrate 2; the protrusions 61A, 61B overlapping the moving element 32 as viewed in a plan view from the Z-axis direction and provided protruding toward the moving element 32 from the exposure parts 9A, 9B at the substrate 2; and the covered electrode 86 provided at the top 611 of the protrusions 61A, 61B and having the same electric potential as the moving element 32, as described above.

Since the protrusions 61A, 61B are provided within the first detection electrode 81 in this way, the protrusions 61A, 61B can be provided without sacrificing the area of the first detection electrode 81, specifically, without limiting the expanse of the first detection electrode 81 to the positive side of the X-axis direction. Therefore, even when the protrusions 61A, 61B are provided, a sufficiently large electrostatic capacitance Ca can be secured between the moving element 32 and the first detection electrode 81. Thus, a high detection sensitivity to the acceleration Az can be achieved. Also, since the covered electrode 86 having the same electric potential as the moving element 32 is provided at the top 611 of the protrusions 61A, 61B, an electrostatic attraction is not practically generated between the moving element 32 and the protrusions 61A, 61B. Therefore, the malfunction and sticking of the moving element 32 can be effectively restrained. That is, the inertial sensor 1 can achieve a high sensitivity while restraining the sticking of the moving element 32.

As described above, the inertial sensor 1 has the first dummy electrode 83 as a dummy electrode provided at the substrate 2, overlapping an area of the moving element 32 overlapping the first detection electrode 81 as viewed in a plan view, that is, the asymmetric part 325, and having the same electric potential as the moving element 32. Covering the surface of the substrate 2 with the first dummy electrode 83 in this way can restrain the surface of the substrate 2 from being charged due to the migration of alkali metal ions in the substrate 2. Therefore, an unintended electrostatic attraction that may lead to the malfunction of the moving element 32 can be effectively restrained from occurring between the substrate 2 and the moving element 32. Thus, the inertial sensor 1 can detect the acceleration Az more accurately.

As described above, the exposure parts 9A, 9B open to the outer edge of the first detection electrode 81. The inertial sensor 1 has the coupling wiring 87 provided at the exposure parts 9A, 9B and coupling the first dummy electrode 83 and the covered electrode 86 together. Thus, the covered electrode 86 can be provided with the same electric potential as the moving element 32 by a simple configuration.

As described above, the first detection electrode 81 is provided between the first dummy electrode 83 and the swing axis J, as viewed in a plan view from the Z-axis direction. The exposure parts 9A, 9B open to the outer edge of the first detection electrode 81 on the first dummy electrode 83 side, that is, on the positive side of the X-axis direction. Thus, the exposure parts 9A, 9B are provided in such a way as to eliminate the first detection electrode 81 located between the covered electrode 86 and the first dummy electrode 83. This makes it easier to lay out the coupling wiring 87 and electrically couple the first dummy electrode 83 and the covered electrode 86 together via the coupling wiring 87. Also, the forming area of the exposure parts 9A, 9B can be made small and the reduction in the area of the first detection electrode 81 due to the provision of the exposure parts 9A, 9B can be effectively restrained.

Second Embodiment

Figure 8:
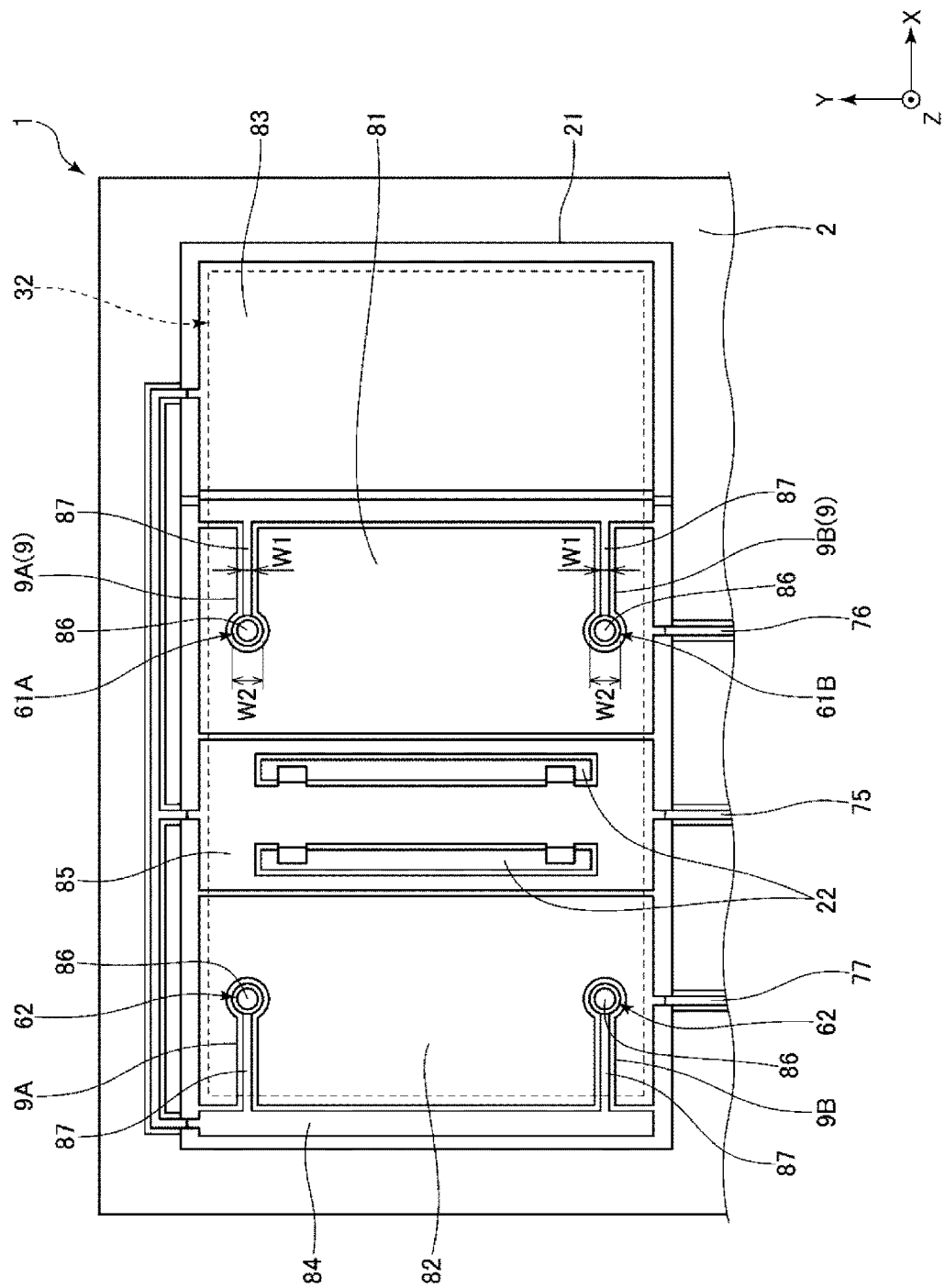
FIG. 8 is a plan view of a substrate provided in an inertial sensor according to a second embodiment.

FIG. 8 is a plan view of a substrate provided in an inertial sensor according to a second embodiment.

This embodiment is similar to the first embodiment except that the configuration of the coupling wiring 87 is different. In the description below, this embodiment is described mainly in terms of its difference from the foregoing embodiment and the description of similar matters is omitted. In FIG. 8, components similar to those in the foregoing embodiment are denoted by the same reference signs. In this embodiment, the first detection electrode 81 side and the second detection electrode 82 side have similar configurations. Therefore, in the description below, the first detection electrode 81 side is described as a representative example and the description of the second detection electrode 82 side is omitted.

In the inertial sensors 1 shown in FIG. 8, the width W1 of the coupling wiring 87 is smaller than the width W2 of the covered electrode 86. That is, W1<W2 holds. For example, when the width W1 is made smaller than the width W1 in the first embodiment so as to satisfy such a relationship, the exposure parts 9A, 9B can be made narrower than in the first embodiment and the area of the first detection electrode 81 can be increased accordingly. Therefore, the detection sensitivity to the acceleration Az becomes higher than in the first embodiment. On the other hand, when the width W2 is made greater than the width W2 in the first embodiment so as to satisfy such a relationship, the protrusions 61A, 61B can be made larger than in the first embodiment and accordingly the protrusions 61A, 61B have a higher mechanical strength. Therefore, the excessive swing of the moving element 32 can be regulated more securely.

The relationship between W1 and W2 is not particularly limited, provided that W1<W2 holds. However, for example, 0.1≤W1/W2≤0.9 is preferable and 0.3≤W1/W2≤0.7 is more preferable. Satisfying such a relationship can more effectively achieve the foregoing effect and can also effectively restrain an increase in the risk that the covered electrode 86 may become too narrow and consequently break.

The second embodiment as described above can achieve effects similar to those of the first embodiment.

Third Embodiment

Figure 9:
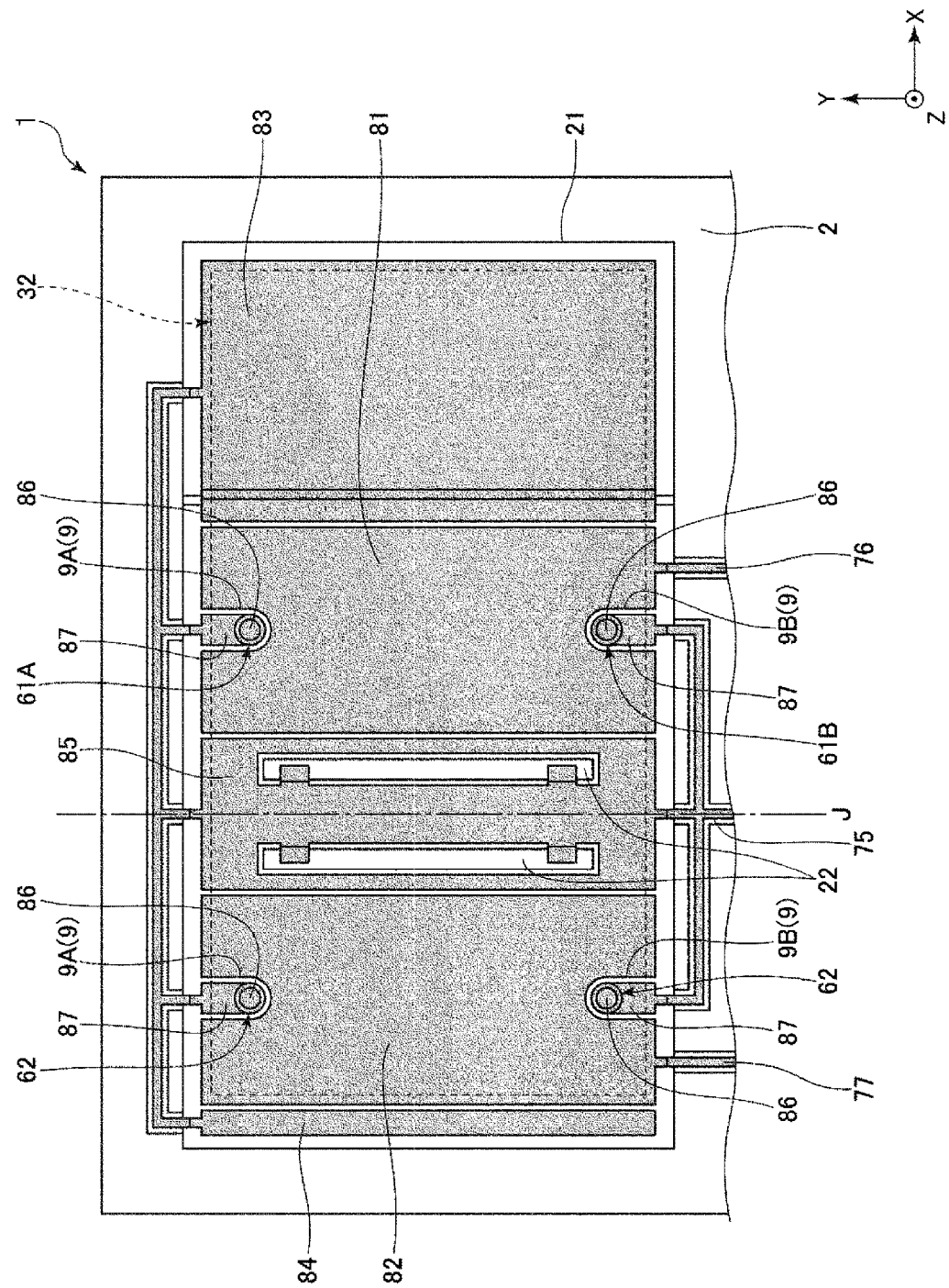
FIG. 9 is a plan view of a substrate provided in an inertial sensor according to a third embodiment.

FIG. 9 is a plan view of a substrate provided in an inertial sensor according to a third embodiment.

This embodiment is similar to the first embodiment except that the configuration of the exposure part 9 is different. In the description below, this embodiment is described mainly in terms of its difference from the foregoing embodiment and the description of similar matters is omitted. In FIG. 9, components similar to those in the foregoing embodiment are denoted by the same reference signs. In this embodiment, the first detection electrode 81 side and the second detection electrode 82 side have similar configurations. Therefore, in the description below, the first detection electrode 81 side is described as a representative example and the description of the second detection electrode 82 side is omitted.

In the inertial sensor 1 shown in FIG. 9, the exposure parts 9A, 9B extend along the Y-axis direction. Of these, the exposure part 9A located on the positive side of the Y-axis direction and including the protrusion 61A is closed at its end on the negative side of the Y-axis direction and is open at its end on the positive side of the Y-axis direction to the outer edge of the positive side of the Y-axis direction of the first detection electrode 81. Meanwhile, the exposure part 9B located on the negative side of the Y-axis direction and including the protrusion 61B is closed at its end on the positive side of the Y-axis direction and is open at its end on the negative side of the Y-direction to the outer edge of on the negative side of the Y-axis direction of the first detection electrode 81.

The coupling wiring 87 provided in the exposure part 9A extends along the Y-axis direction, similarly to the exposure part 9A. This coupling wiring 87 electrically couples the covered electrode 86 provided at the protrusion 61A and the wiring 75 located further to the positive side of the Y-axis direction than the first detection electrode 81. Meanwhile, the coupling wiring 87 provided in the exposure part 9B extends along the Y-axis direction, similarly to the exposure part 9B. This coupling wiring 87 electrically couples the covered electrode 86 provided at the protrusion 61B and the wiring 75 located further to the negative side of the Y-axis direction than the first detection electrode 81. Such a configuration makes it easier to lay out the coupling wiring 87 and electrically couple the moving element 32 and the covered electrode 86 together. Also, depending on the arrangement of the protrusions 61A, 61B, the forming range of the exposure parts 9A, 9B may be smaller than in the first embodiment and the reduction in the area of the first detection electrode 81 can be restrained accordingly.

The distance between the first detection electrode 81 and the moving element 32 when the moving element 32 seesaws becomes shorter as it goes toward the positive side of the X-axis direction, that is, away from the swing axis J. Therefore, the electrostatic capacitance formed between the first detection electrode 81 and the moving element 32 becomes greater as it goes toward the positive side of the X-axis. Thus, since the exposure parts 9A, 9B extend in the Y-axis direction as in this embodiment, the exposure parts 9A, 9B are not formed at the distal end part of the first detection electrode 81, that is, in the area where a large electrostatic capacitance can be formed with the moving element 32. Therefore, the reduction in the electrostatic capacitance Ca due to the provision of the exposure parts 9A, 9B can be restrained to a small amount. This can make the electrostatic capacitance Ca higher and the detection sensitivity to the acceleration Az higher than in the first embodiment.

As described above, the exposure parts 9A, 9B are open to the outer edge at one side of the Y-axis direction, in this embodiment, to the outer edge at the positive side of the Y-axis direction. Such a configuration makes it easier to lay out the coupling wiring 87 and electrically couple the moving element 32 and the covered electrode 86 together. Also, depending on the position of the protrusions 61A, 61B, the forming range of the exposure parts 9A, 9B may be smaller than in the first embodiment. In that case, the reduction in the area of the first detection electrode 81 can be restrained further. Moreover, the reduction in the electrostatic capacitance Ca due to the provision of the exposure parts 9A, 9B can be restrained to a small amount. This can make the electrostatic capacitance Ca higher and the detection sensitivity to the acceleration Az higher than in the first embodiment.

The third embodiment as described above can achieve effects similar to those of the first embodiment.

Fourth Embodiment

Figure 10:
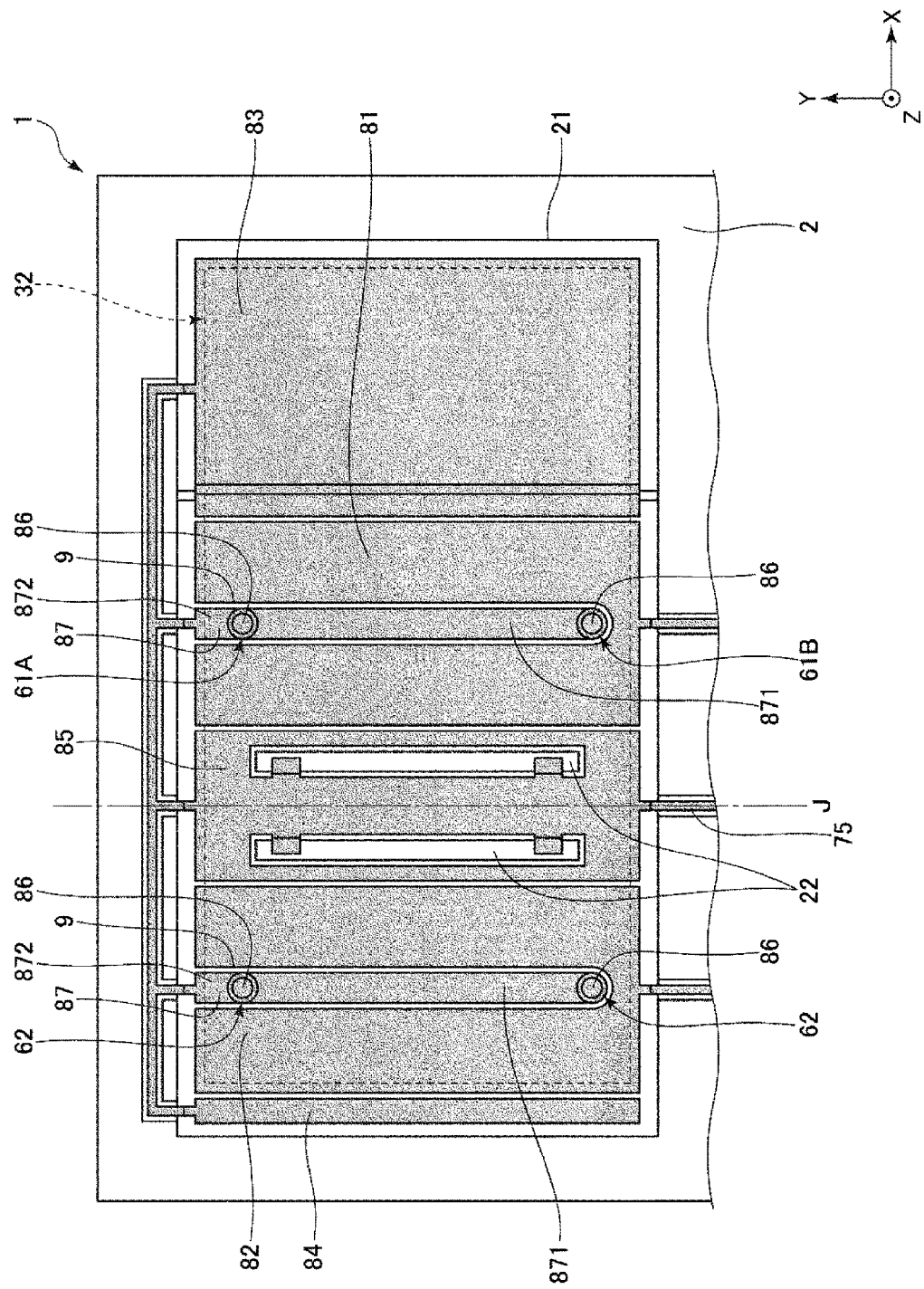
FIG. 10 is a plan view of a substrate provided in an inertial sensor according to a fourth embodiment.

FIG. 10 is a plan view of a substrate provided in an inertial sensor according to a fourth embodiment.

This embodiment is similar to the first embodiment except that the configuration of the exposure part 9 is different. In the description below, this embodiment is described mainly in terms of its difference from the foregoing embodiment and the description of similar matters is omitted. In FIG. 10, components similar to those in the foregoing embodiment are denoted by the same reference signs. In this embodiment, the first detection electrode 81 side and the second detection electrode 82 side have similar configurations. Therefore, in the description below, the first detection electrode 81 side is described as a representative example and the description of the second detection electrode 82 side is omitted.

In the inertial sensor 10 shown in FIG. 10, one exposure part 9 is provided at the first detection electrode 81. This exposure part 9 extends along the Y-axis direction. The protrusions 61A, 61B are provided on the inner side of the exposure part 9.

The exposure part 9 is closed at its end on the negative side of the Y-axis direction and is open at its end on the positive side of the Y-axis direction to the outer edge of the first detection electrode 81. The coupling wiring 87 provided in the exposure part 9 extends along the Y-axis direction, similarly to the exposure part 9. The coupling wiring 87 has a first part 871 provided between the pair of protrusions 61A, 61B and electrically coupling the protrusions 61A, 61B together, and a second part 872 provided between the protrusion 61A located on the positive side of the Y-axis direction and the wiring 75 located further to the positive side of the Y-axis direction than the first detection electrode 81, and electrically coupling the protrusion 61A and the wiring 75 together. Such a configuration makes it easier to lay out the coupling wiring 87 and electrically couple the moving element 32 and the covered electrode 86 together.

Also, for example, in the third embodiment, the coupling wiring 87 is led out from both side of the first detection electrode 81, whereas in this embodiment, the coupling wiring 87 is lead out from one side of the first detection electrode 81. Therefore, the inertial sensor 1 can be miniaturized further than in the third embodiment.

The distance between the first detection electrode 81 and the moving element 32 when the moving element 32 seesaws becomes shorter as it goes toward the positive side of the X-axis direction, that is, away from the swing axis J. That is, the electrostatic capacitance formed between the first detection electrode 81 and the moving element 32 becomes greater as it goes toward the positive side of the X-axis. Thus, since the exposure part 9 extends in the Y-axis direction as in this embodiment, the exposure part 9 can be restrained from being formed at the distal end part of the first detection electrode 81, that is, in the area where a large electrostatic capacitance can be formed with the moving element 32. Therefore, the reduction in the electrostatic capacitance Ca due to the provision of the exposure part 9 can be restrained to a small amount. This can make the electrostatic capacitance Ca higher and the detection sensitivity to the acceleration Az higher than in the first embodiment.

The fourth embodiment as described above can achieve effects similar to those of the first embodiment.

Fifth Embodiment

Figure 11:
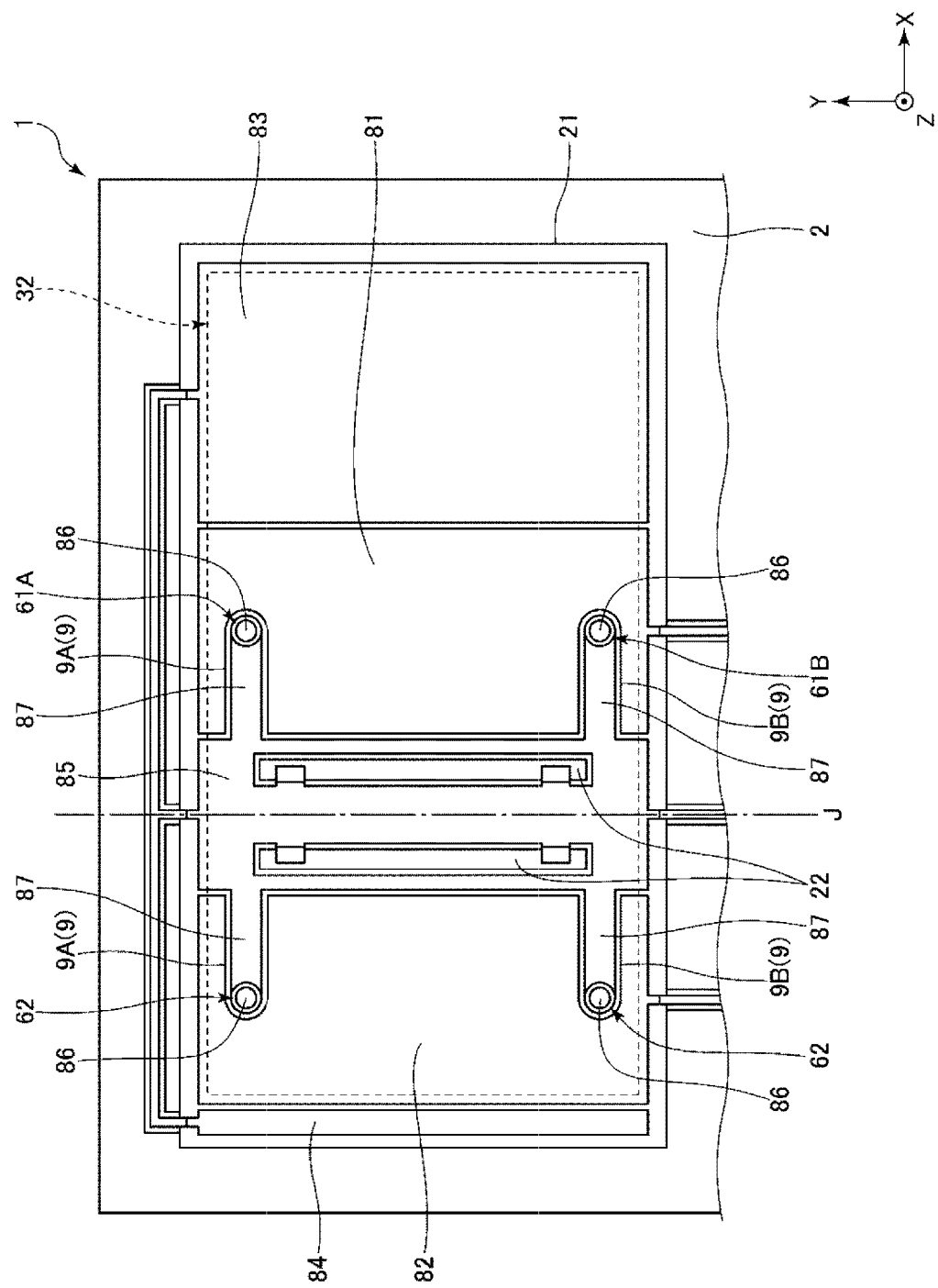
FIG. 11 is a plan view of a substrate provided in an inertial sensor according to a fifth embodiment.

FIG. 11 is a plan view of a substrate provided in an inertial sensor according to a fifth embodiment.

This embodiment is similar to the first embodiment except that the configuration of the exposure part 9 is different. In the description below, this embodiment is described mainly in terms of its difference from the foregoing embodiment and the description of similar matters is omitted. In FIG. 11, components similar to those in the foregoing embodiment are denoted by the same reference signs. In this embodiment, the first detection electrode 81 side and the second detection electrode 82 side have similar configurations. Therefore, in the description below, the first detection electrode 81 side is described as a representative example and the description of the second detection electrode 82 side is omitted.

In the inertial sensor 1 shown in FIG. 11, the exposure parts 9A, 9B extend linearly from the protrusions 61A, 61B toward the negative side of the X-axis direction and are open to the outer edge at the negative side of the X-axis direction of the first detection electrode 81, that is, to the outer edge at the third dummy electrode 85 side. Each of the coupling wirings 87 provided in the exposure parts 9A, 9B electrically couples the covered electrode 86 and the third dummy electrode 85 together.

In such a configuration, the exposure parts 9A, 9B are provided in such a way as to eliminate the first detection electrode 81 located between the covered electrode 86 and the third dummy electrode 85. This makes it easier to lay out the coupling wiring 87 and electrically couple the third dummy electrode 85 and the covered electrode 86 together via the coupling wiring 87. Also, depending on the position of the protrusions 61A, 61B, the forming range of the exposure parts 9A, 9B may be smaller than in the first embodiment. In that case, the reduction in the area of the first detection electrode 81 can be restrained further.

The distance between the first detection electrode 81 and the moving element 32 when the moving element 32 seesaws becomes shorter as it goes toward the positive side of the X-axis direction, that is, away from the swing axis J. That is, the electrostatic capacitance formed between the first detection electrode 81 and the moving element 32 becomes greater as it goes toward the positive side of the X-axis. Thus, since the exposure parts 9A, 9B extend further to the negative side of the X-axis direction than the protrusions 61A, 61B as in this embodiment, the exposure part 9 can be restrained from being not formed at the distal end part of the first detection electrode 81, that is, in the area where a large electrostatic capacitance can be formed with the moving element 32. Therefore, the reduction in the electrostatic capacitance Ca due to the provision of the exposure parts 9A, 9B can be restrained to a small amount. This can make the electrostatic capacitance Ca higher and the detection sensitivity to the acceleration Az higher than in the first embodiment.

As described above, the third dummy electrode 85 as a dummy electrode is provided between the first detection electrode 81 and the swing axis J, as viewed in a plan view from the Z-axis direction, and the exposure parts 9A, 9B are open to the outer edge at the third dummy electrode 85 side, that is, on the negative side of the X-axis direction. Thus, the exposure parts 9A, 9B are provided in such a way as to eliminate the first detection electrode 81 located between the covered electrode 86 and the third dummy electrode 85. This makes it easier to lay out the coupling wiring 87 and electrically couple the third dummy electrode 85 and the covered electrode 86 together via the coupling wiring 87. Also, the forming area of the exposure parts 9A, 9B can be reduced further and the reduction in the area of the first detection electrode 81 due to the provision of the exposure parts 9A, 9B can be effectively restrained.

The fifth embodiment as described above can achieve effects similar to those of the first embodiment.

However, the configuration of the exposure part 9 is not particularly limited. For example, one exposure part 9 in a T-shape as shown in FIG. 6 may be provided. Also, the exposure parts 9A, 9B may extend in a direction tilted from both the X-axis and the Y-axis, as shown in FIG. 7.

Sixth Embodiment

Figure 12:
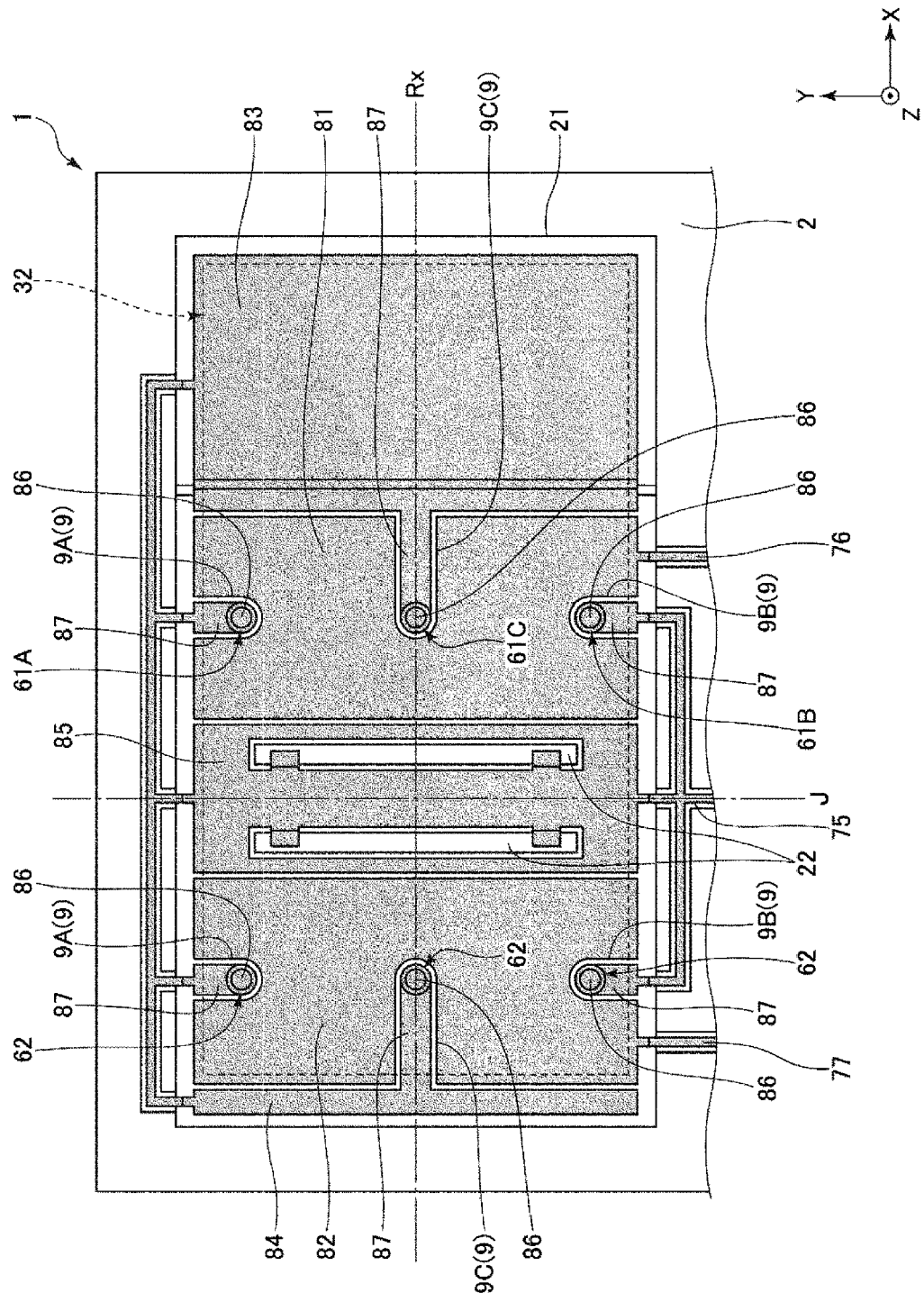
FIG. 12 is a plan view of a substrate provided in an inertial sensor according to a sixth embodiment.

FIG. 12 is a plan view of a substrate provided in an inertial sensor according to a sixth embodiment.

This embodiment is similar to the third embodiment except that a protrusion 61C and an exposure part 9C are added. In the description below, this embodiment is described mainly in terms of its difference from the foregoing embodiment and the description of similar matters is omitted. In FIG. 12, components similar to those in the foregoing embodiment are denoted by the same reference signs. In this embodiment, the first detection electrode 81 side and the second detection electrode 82 side have similar configurations. Therefore, in the description below, the first detection electrode 81 side is described as a representative example and the description of the second detection electrode 82 side is omitted.

In the inertial sensor 1 shown in FIG. 12, a protrusion 61C is provided in addition to the protrusions 61A, 61B. The three protrusions 61A, 61B, 61C are arrayed along the Y-axis direction. The protrusion 61C overlaps the imaginary straight line Rx, as viewed in a plan view from the Z-axis direction. Accordingly, in the inertial sensor 1, an exposure part 9C, where the protrusion 61C is provided, is arranged in addition to the exposure parts 9A, 9B, where the protrusions 61A, 61B are provided. The exposure part 9C has a configuration similar to that in the first embodiment. The exposure part 9C extends from the protrusion 61C toward the positive side of the X-axis direction and is open to the outer edge at the positive side of the X-axis direction of the first detection electrode 81. The coupling wiring 87 provided in the exposure part 9C electrically couples the covered electrode 86 covering the protrusion 61C, and the first dummy electrode 83.

The sixth embodiment as described above can achieve effects similar to those of the first embodiment.

Seventh Embodiment

Figure 13:
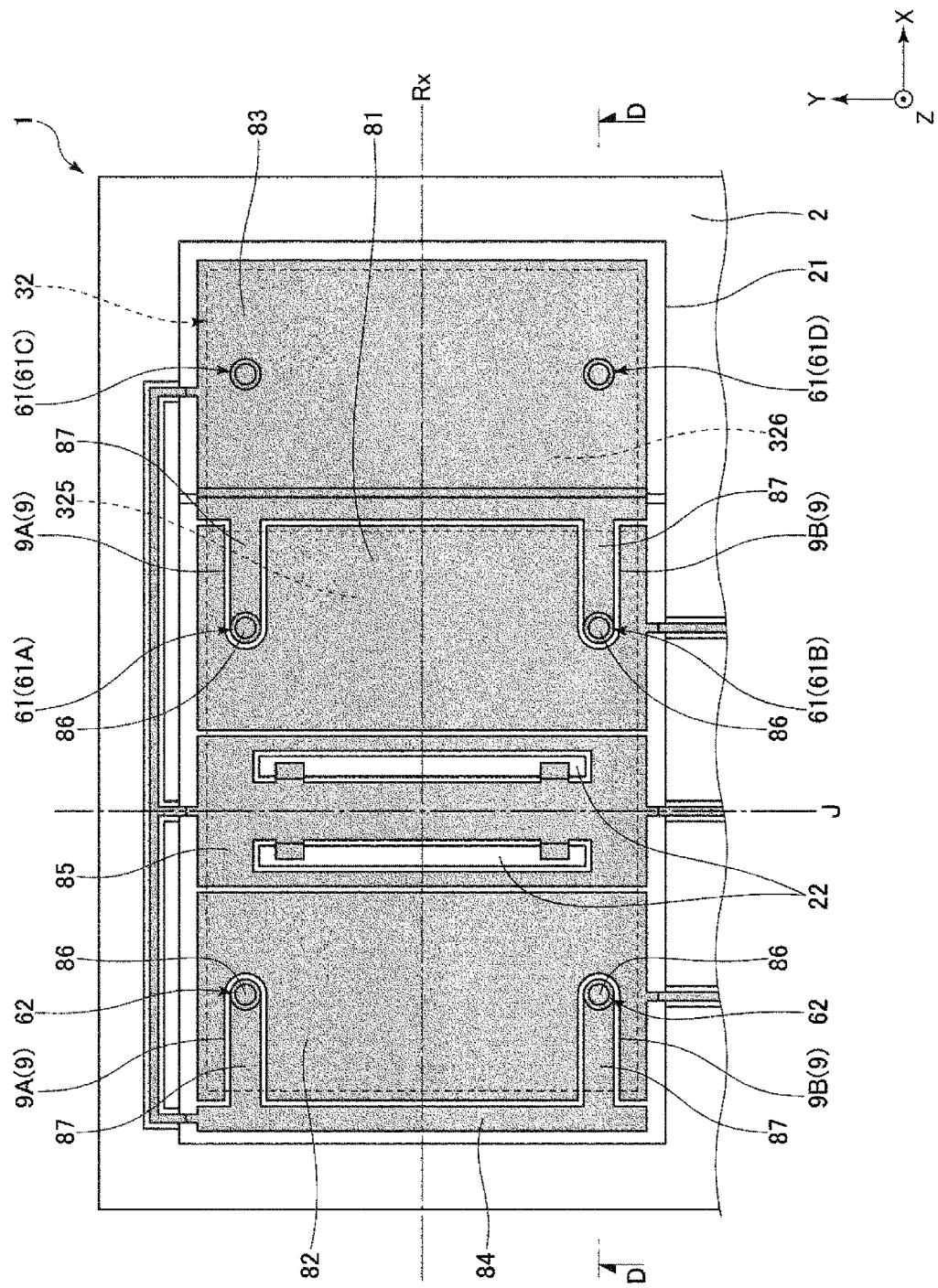
FIG. 13 is a plan view of a substrate provided in an inertial sensor according to a seventh embodiment.
Figure 14:
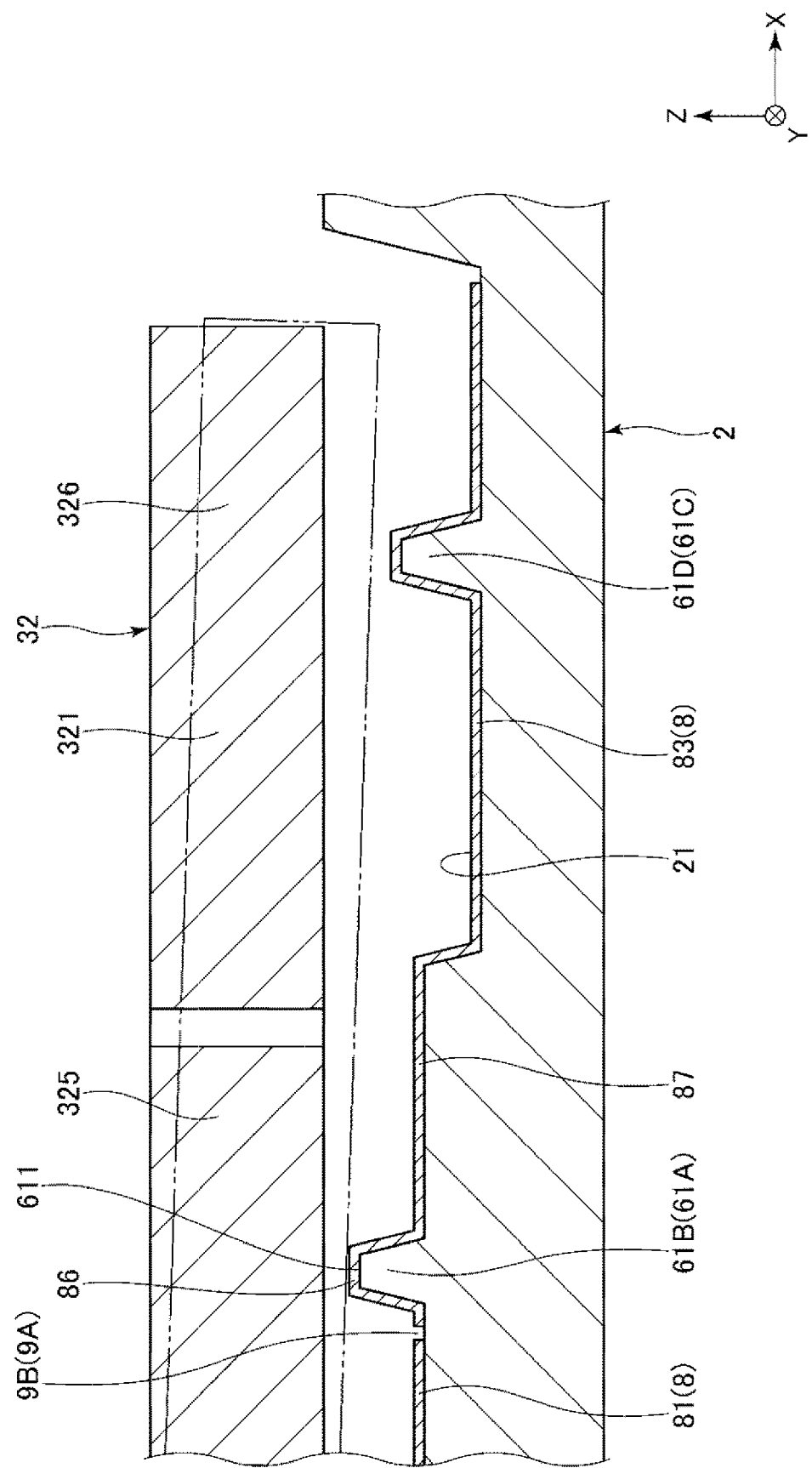
FIG. 14 is a cross-sectional view taken along D-D in FIG. 13.

FIG. 13 is a plan view of a substrate provided in an inertial sensor according to a seventh embodiment. FIG. 14 is a cross-sectional view taken along D-D in FIG. 13.

This embodiment is similar to the first embodiment except that the configuration of the protrusion 6 is different. In the description below, this embodiment is described mainly in terms of its difference from the foregoing embodiment and the description of similar matters is omitted. In FIGS. 13 and 14, components similar to those in the foregoing embodiment are denoted by the same reference signs.

In the inertial sensor 1 shown in FIG. 13, the protrusion 61 has protrusions 61C, 61D located further from the swing axis J than the protrusions 61A, 61B and arrayed along the Y-axis direction, in addition to the protrusions 61A, 61B. The protrusion 61C is arrayed with the protrusion 61A along the X-axis direction. The protrusion 61D is arrayed with the protrusion 61B along the X-axis direction. The protrusions 61C, 61D are provided overlapping the first dummy electrode 83 and covered with the first dummy electrode 83. Such protrusions 61C, 61D come into contact with the asymmetric part 326 of the first moving part 321 when the moving element 32 seesaw excessively.

As shown in FIG. 14, the protrusions 61C, 61D are respectively lower than the protrusions 61A, 61B. When the moving element 32 seesaws excessively, the protrusions 61A, 61B first come into contact with the moving element 32 and the protrusions 61C, 61D subsequently come into contact with the moving element 32. Specifically, when the inertial sensor seesaws excessively, first, the symmetric part 325 of the first moving part 321 comes into contact with the protrusions 61A, 61B, as indicated by a double-dashed chain line in the illustration. Then, when the moving element 32 does not stop seesawing and continues seesawing even after the first moving part 321 comes into contact with the protrusions 61A, 61B, the asymmetric part 326 of the first moving part 321 comes into contact with the protrusions 61C, 61D. That is, in this embodiment, the excessive seesawing of the moving element 32 is regulated by contact in two stages. Such a configuration provides the inertial sensor 1 in which damage to the moving element 32 is restrained and which has high mechanical strength.

The seventh embodiment as described above can achieve effects similar to those of the first embodiment.

However, the configuration of the inertial sensor 1 is not limited to this. For example, when the moving element 32 seesaws excessively, the protrusions 61A, 61B and the protrusions 61C, 61D may simultaneously come into contact with the moving element 32, or the protrusions 61A, 61B may come into contact with the moving element 32 after the protrusions 61C, 61D come into contact with the moving element 32. Also, one of the protrusions 61C, 61D may be omitted. One or more additional protrusions arrayed with protrusions 61C, 61D along the Y-axis direction may be provided.

Eighth Embodiment

Figure 15:
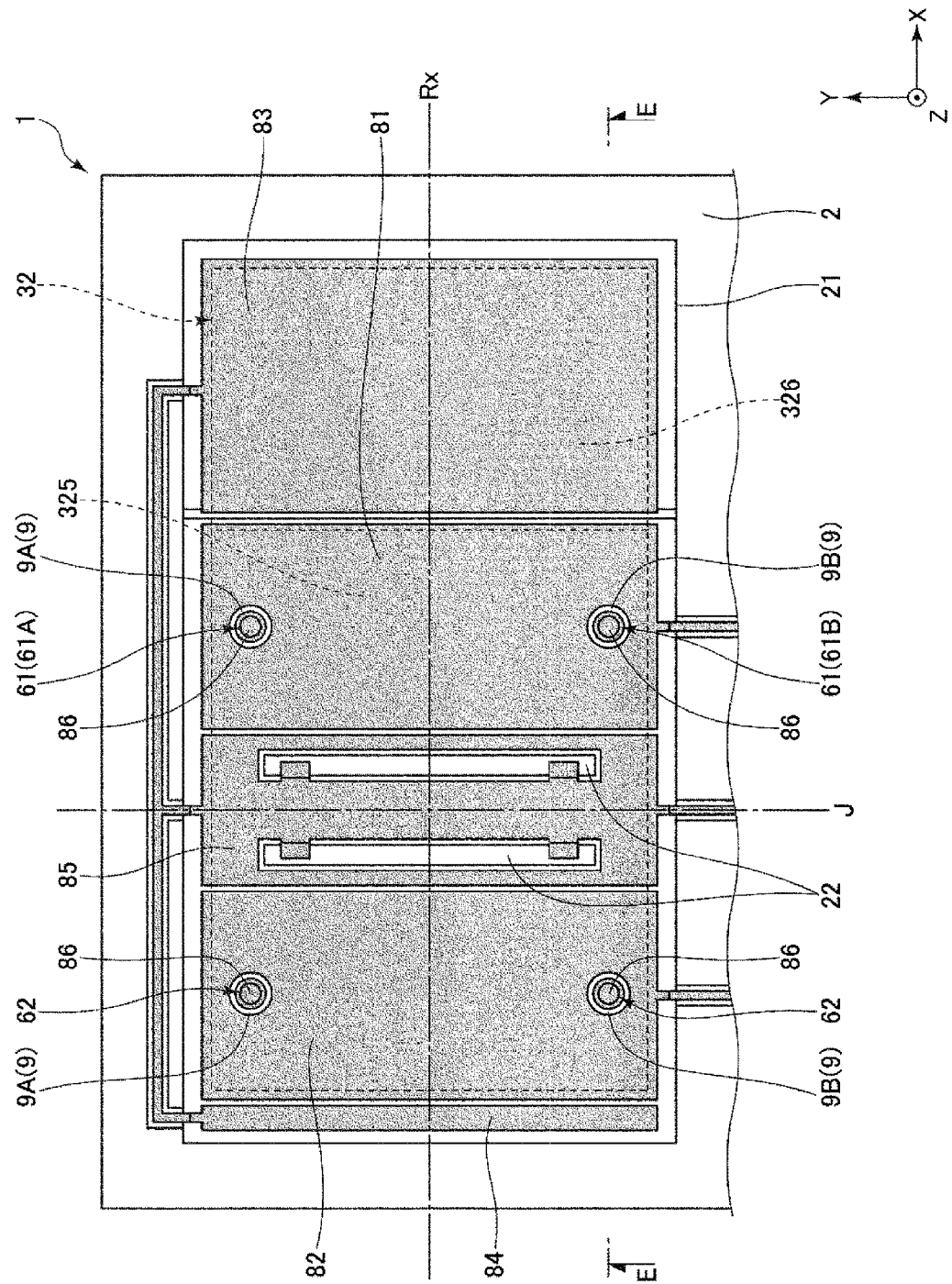
FIG. 15 is a plan view of a substrate provided in an inertial sensor according to an eighth embodiment.
Figure 16:
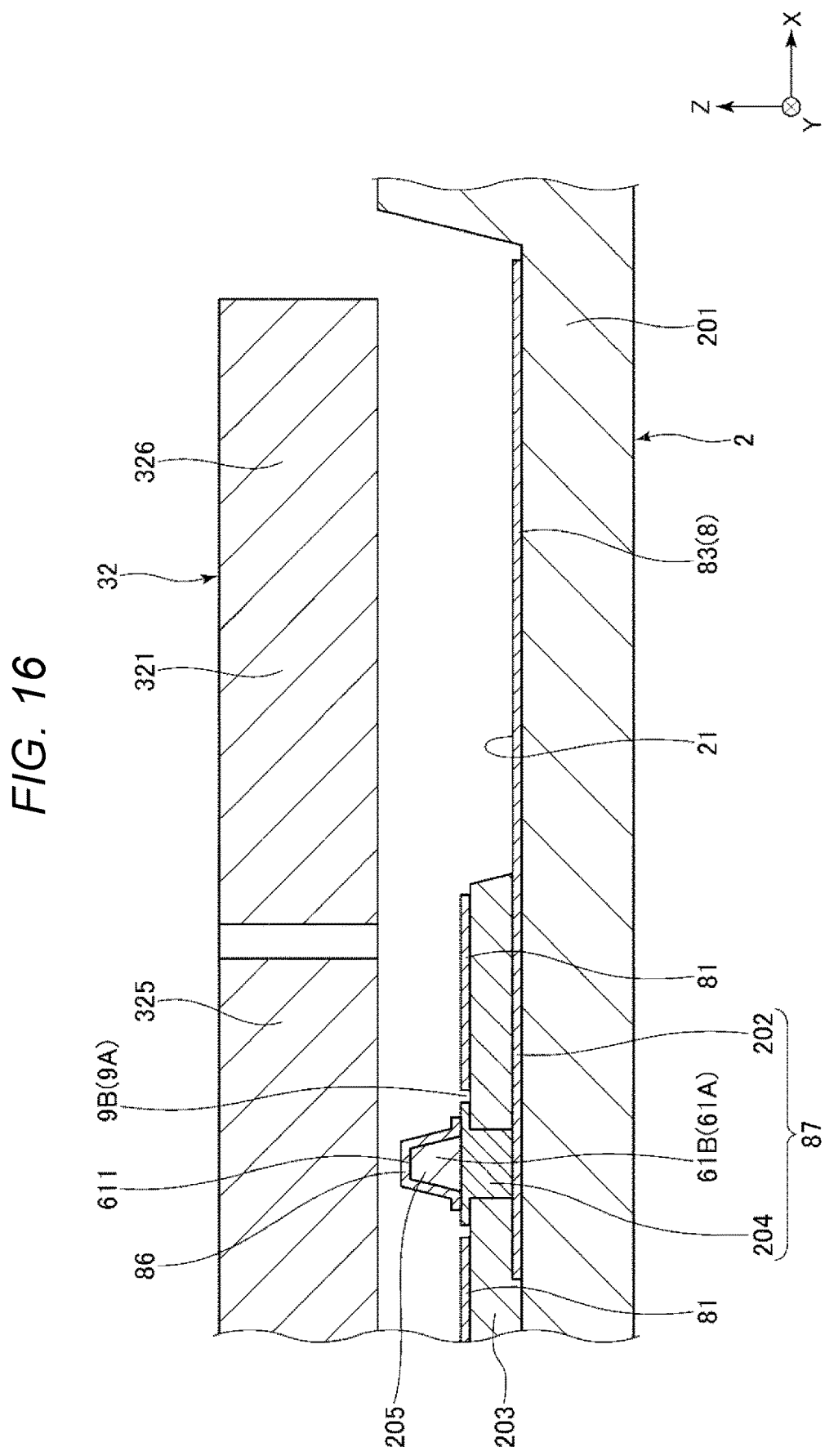
FIG. 16 is a cross-sectional view taken along E-E in FIG. 15.

FIG. 15 is a plan view of a substrate provided in an inertial sensor according to an eighth embodiment. FIG. 16 is a cross-sectional view taken along E-E in FIG. 15.

This embodiment is similar to the first embodiment except that the configuration of the substrate 2 and the exposure part 9 is different. In the description below, this embodiment is described mainly in terms of its difference from the foregoing embodiment and the description of similar matters is omitted. In FIGS. 15 and 16, components similar to those in the foregoing embodiment are denoted by the same reference signs. In this embodiment, the first detection electrode 81 side and the second detection electrode 82 side have similar configurations. Therefore, in the description below, the first detection electrode 81 side is described as a representative example and the description of the second detection electrode 82 side is omitted.

In the inertial sensor 1 shown in FIG. 15, each of the exposure parts 9A, 9B provided at the first detection electrode 81 is not open to the outer edge of the first detection electrode 81. That is, each of the exposure parts 9A, 9B is formed as a closed hole with its entire circumference surrounded by the first detection electrode 81. Thus, the exposure parts 9A, 9B can be made smaller. Therefore, the forming range of the exposure parts 9A, 9B is smaller than in the first embodiment, and accordingly the reduction in the area of the first detection electrode 81 can be restrained further.

As shown in FIG. 16, the substrate 2 has a silicon substrate 201 having the recess 21, a wiring layer 202 stacked over the bottom surface of the recess 21, an insulating layer 203 stacked over the wiring layer 202, a wiring layer 204 staked cover the insulating layer 203, and an insulating layer 205 staked over the wiring layer 204. The insulating layer 205 forms the protrusions 61A, 61B. The first dummy electrode 83 is provided at the bottom surface of the recess 21. The first detection electrode 81 is provided over the insulating layer 203. The covered electrode 86 is provided over the insulating layer 205, that is, over the protrusions 61A, 61B. The first dummy electrode 83 is electrically coupled to the covered electrode 86 via the wiring layers 202, 204. That is, in this embodiment, the wiring layers 202, 204 form the coupling wiring 87. The coupling wiring 87 is an internal wiring formed inside the substrate 2. The wiring layers 202, 204 are formed of, for example, aluminum, polysilicon or the like. The insulating layers 203, 205 are formed of, for example, silicon oxide.

As described above, the exposure parts 9A, 9B have a closed shape that is not open to the outer edge of the first detection electrode 81. The inertial sensor 1 has the coupling wiring 87 provided inside the substrate 2 and coupling the first dummy electrode 83 and the covered electrode 86 together. Forming the exposure parts 9A, 9B in such a closed shape can make the exposure parts 9A, 9B smaller. Therefore, the forming range of the exposure parts 9A, 9B is smaller than in the first embodiment, and accordingly the reduction in the area of the first detection electrode 81 can be restrained further.

The eighth embodiment as described above can achieve effects similar to those of the first embodiment.

Ninth Embodiment

Figure 17:
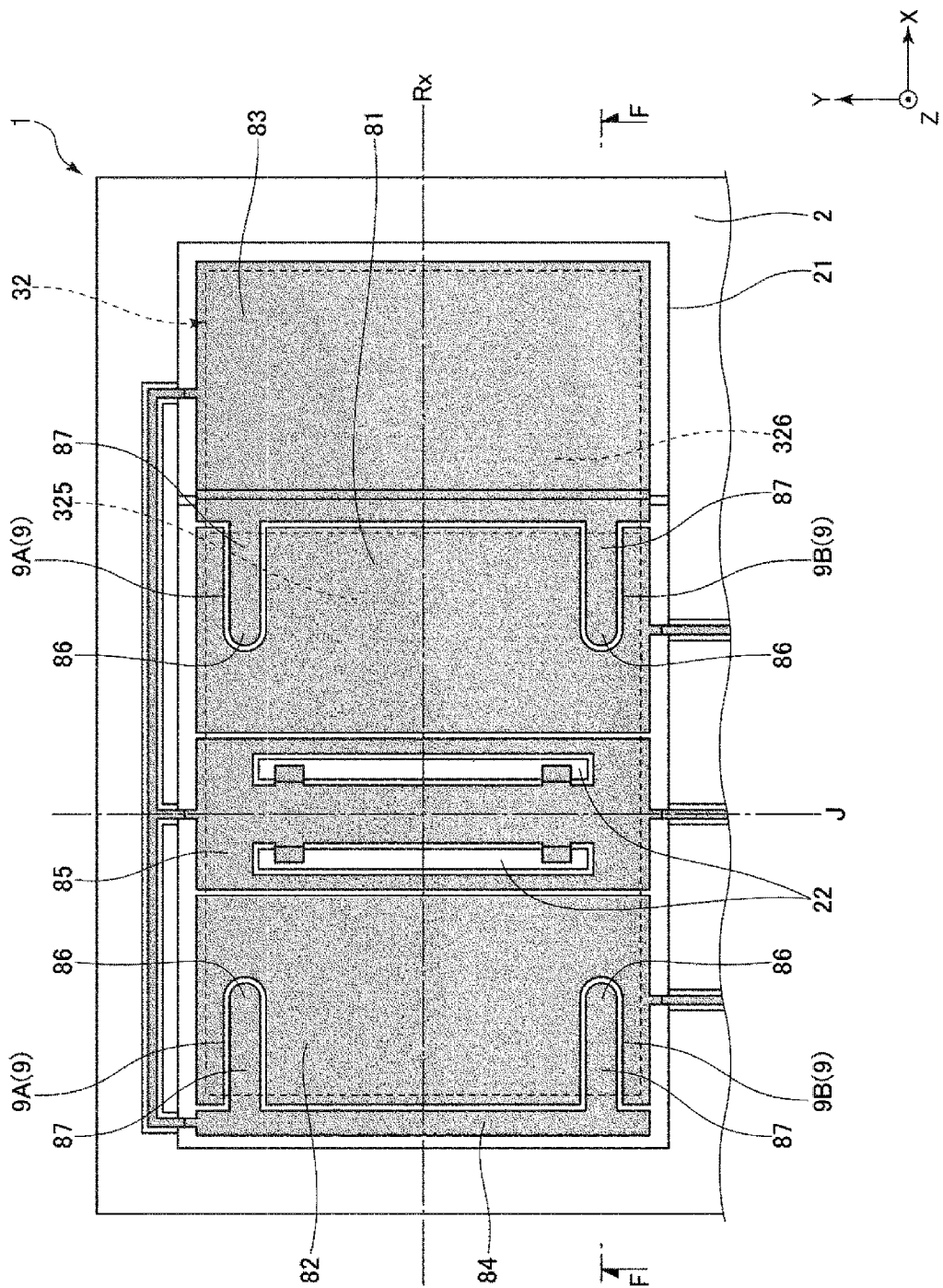
FIG. 17 is a plan view of a substrate provided in an inertial sensor according to a ninth embodiment.
Figure 18:
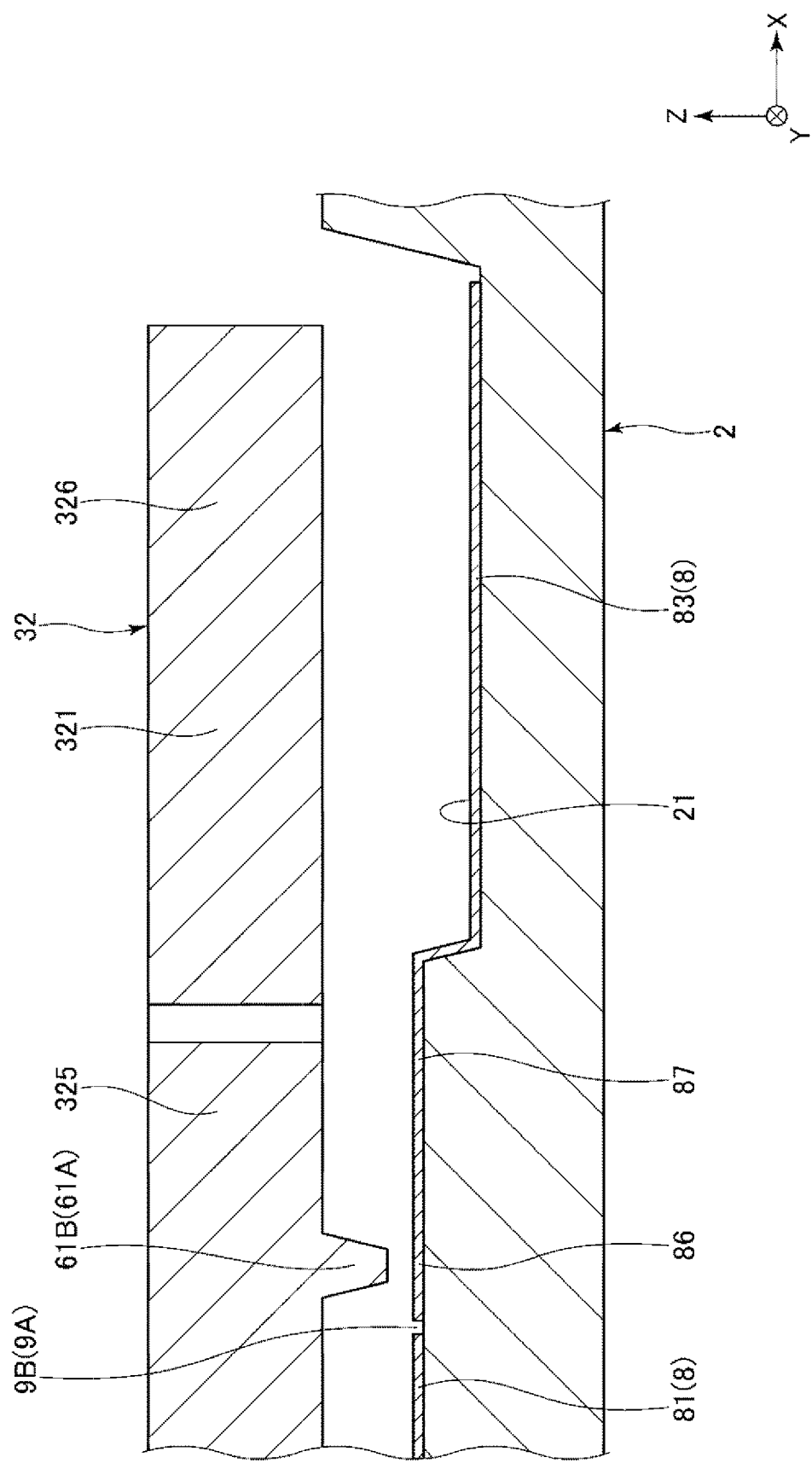
FIG. 18 is a cross-sectional view taken along F-F in FIG. 17.

FIG. 17 is a plan view of a substrate provided in an inertial sensor according to a ninth embodiment. FIG. 18 is a cross-sectional view taken along F-F in FIG. 17.

This embodiment is similar to the first embodiment except that the protrusion 6 is provided at the moving element 32 instead of the substrate 2. In the description below, this embodiment is described mainly in terms of its difference from the foregoing embodiment and the description of similar matters is omitted. In FIGS. 17 and 18, components similar to those in the foregoing embodiment are denoted by the same reference signs.

In the inertial sensor 1 shown in FIG. 17, the protrusion 6 is not provided at the substrate 2. Therefore, the protrusions 61A, 61B do not protrude from the exposure parts 9A, 9B in the first detection electrode 81, and the covered electrode 86 and the coupling wiring 87 are provided planarly. Meanwhile, the protrusions 61A, 61B omitted from the substrate 2 are provided at the moving element 32 and protrude from the lower surface of the moving element 32 toward the bottom surface of the recess 21, as shown in FIG. 18. The protrusions 61A, 61B overlap the covered electrode 86, as viewed in a plan view from the Z-axis direction. When the moving element 32 seesaw excessively, the protrusions 61A, 61B come into contact with the covered electrode 86 before the moving element 32 comes into contact with the substrate 2.

As described above, the inertial sensor 1 in this embodiment has: the substrate 2; the moving element 32 swinging about the swing axis J along the Y-axis; the first detection electrode 81 as a detection electrode provided at the substrate 2, overlapping the moving element 32 as viewed in a plan view from the Z-axis direction orthogonal to the Y-axis, and forming an electrostatic capacitance with the moving element 32; the exposure parts 9A, 9B provided on the inner side of the first detection electrode 81 and exposing the surface on the moving element 32 side of the substrate 2; the covered electrode 86 provided at the exposure parts 9A, 9B and having the same electric potential as the moving element 32; and the protrusions 61A, 61B overlapping the covered electrode 86 as viewed in a plan view and provided protruding from the moving element 32 toward the covered electrode 86.

As the covered electrode 86 is thus provided inside the first detection electrode 81, the covered electrode 86 can be provided without sacrificing the area of the first detection electrode 81, specifically, without limiting the expanse of the first detection electrode 81 to the positive side of the X-axis direction. Therefore, even when the covered electrode 86 is provided, a sufficiently large electrostatic capacitance Ca can be secured between the moving element 32 and the first detection electrode 81. This can achieve a high detection sensitivity to the acceleration Az. Also, since the covered electrode 86 having the same electric potential as the moving element 32 is provided at the part facing the protrusions 61A, 61B, an electrostatic attraction is practically not generated between the moving element 32 and the protrusions 61A, 61B. This can effectively restrain the malfunction and sticking of the moving element 32. That is, the inertial sensor 1 can achieve a high sensitivity while restraining the sticking of the moving element 32.

Tenth Embodiment

Figure 19:
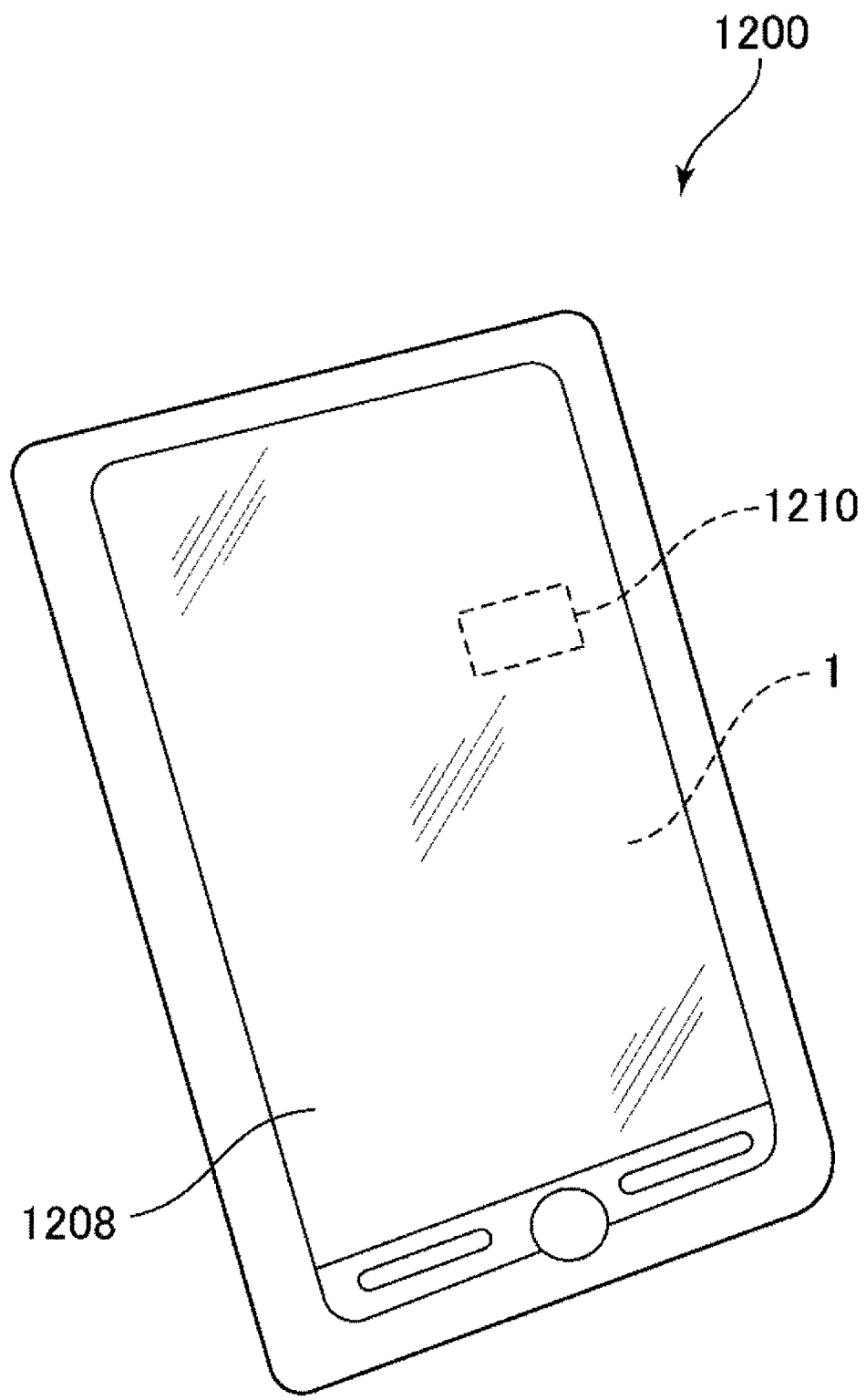
FIG. 19 is a plan view showing a smartphone as an electronic apparatus according to a tenth embodiment.

FIG. 19 is a plan view showing a smartphone as an electronic apparatus according to a tenth embodiment.

A smartphone 1200 shown in FIG. 19 is a smartphone to which the electronic apparatus according to the present disclosure is applied. The inertial sensor 1 and a control circuit 1210 performing control based on a detection signal outputted from the inertial sensor 1 are built in the smartphone 1200. Detection data detected by the inertial sensor 1 is transmitted to the control circuit 1210. The control circuit 1210 recognizes the attitude and behavior of the smartphone 1200, based on the received detection data, and can change a display image displayed at a display unit 1208, output a warning sound or a sound effect, and drive a vibration motor to vibrate the main body.

Such a smartphone 1200 as an electronic apparatus has the inertial sensor 1 and the control circuit 1210 performing control based on a detection signal outputted from the inertial sensor 1. Therefore, the smartphone 1200 can have the effects of the inertial sensor 1 and achieve high reliability.

The electronic apparatus according to the present disclosure can be applied not only to the smartphone 1200 but also to a personal computer, digital still camera, tablet terminal, timepiece, smartwatch, inkjet printer, laptop personal computer, television, wearable terminal such as smart glasses or HMD (head-mounted display), video camera, videotape recorder, car navigation device, pager, electronic organizer, electronic dictionary, electronic translator, electronic calculator, electronic game device, toy, word processor, workstation, videophone, security monitor, electronic binoculars, POS terminal, medical equipment, fishfinder, various measuring devices, mobile terminal base station apparatus, various instruments for vehicle, railway train, airplane, helicopter, ship and the like, flight simulator, network server, and the like.

Eleventh Embodiment

Figure 20:
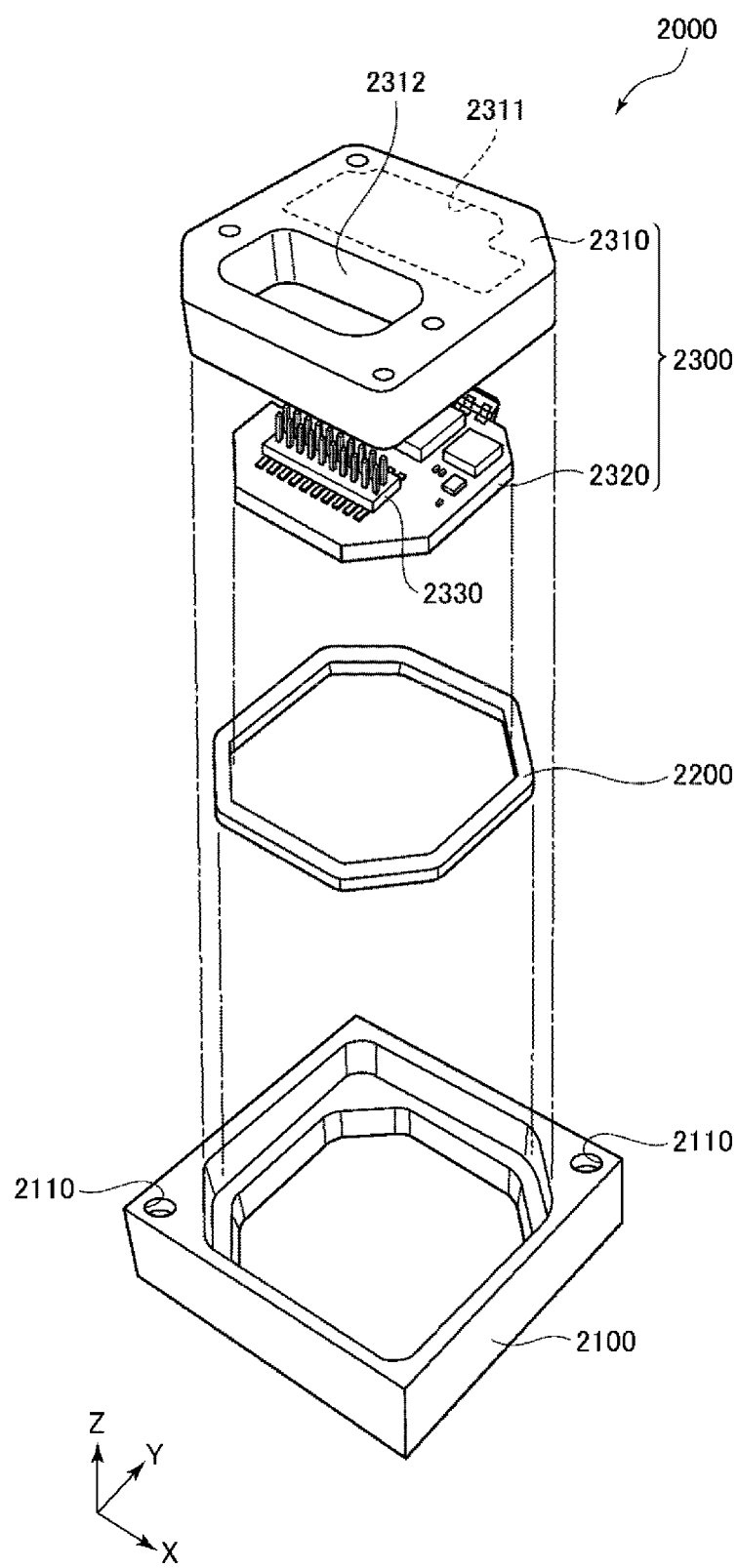
FIG. 20 is an exploded perspective view showing an inertial measurement unit according to an eleventh embodiment.
Figure 21:
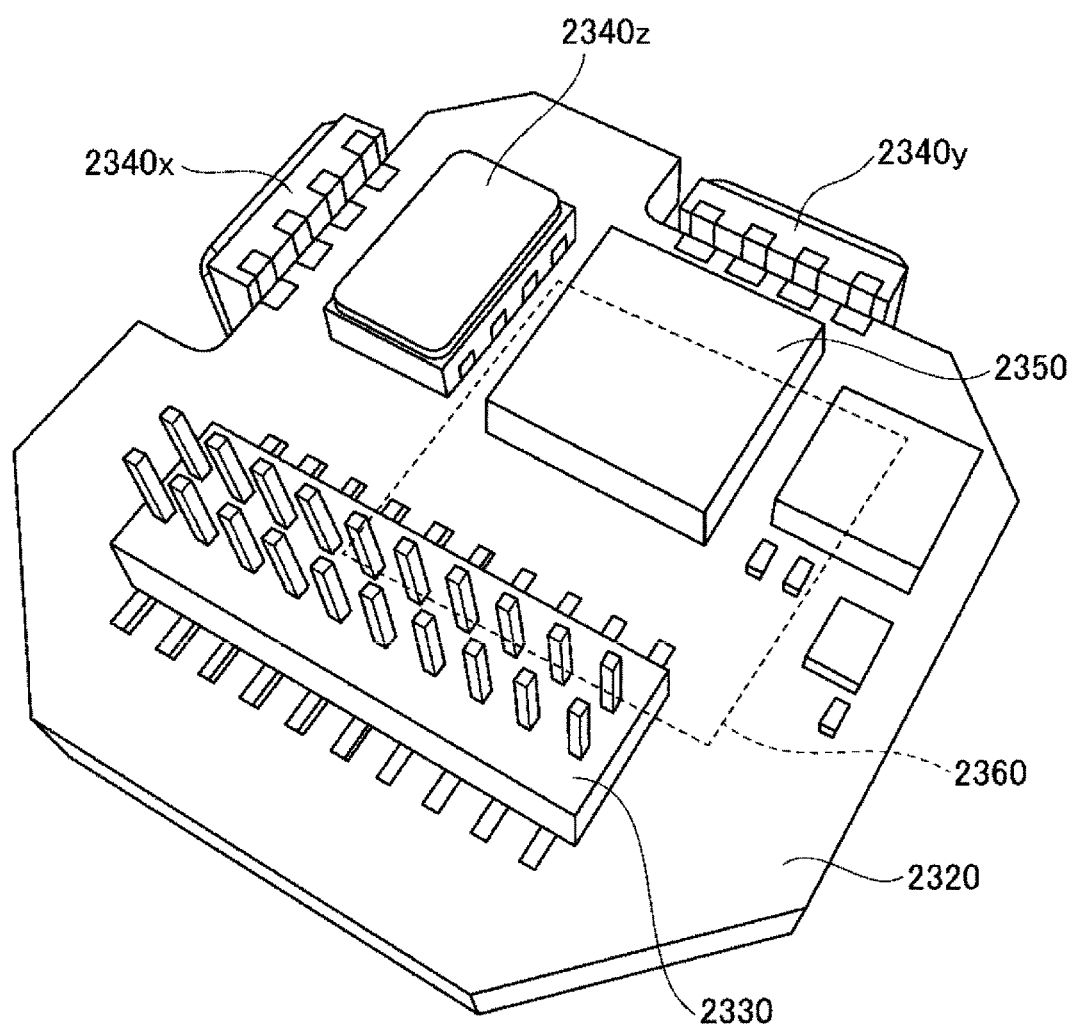
FIG. 21 is a perspective view of a substrate provided in the inertial measurement unit shown in FIG. 20.

FIG. 20 is an exploded perspective view showing an inertial measurement unit according to an eleventh embodiment. FIG. 21 is a perspective view of a substrate provided in the inertial measurement unit shown in FIG. 20.

An inertial measurement unit 2000 (IMU) shown in FIG. 20 is an inertial measurement unit detecting an attitude and behavior of an installation target device such as an automobile or robot. The inertial measurement unit 2000 functions as a so-called 6-axis motion sensor having a 3-axis acceleration sensor and a 3-axis angular velocity sensor.

The inertial measurement unit 2000 is a rectangular parallelepiped having a substantially square planar shape. Screw holes 2110 as fixing parts are formed near two vertices located along a diagonal line of the square. Two screws can be inserted into the two screw holes 2110 to fix the inertial measurement unit 2000 to an installation target surface of an installation target object such as an automobile. Properly selecting components or changing design enables miniaturization of the inertial measurement unit 2000 into a size that can be installed, for example, in a smartphone or digital camera.

The inertial measurement unit 2000 has an outer case 2100, a bonding member 2200, and a sensor module 2300. The sensor module 2300 is inserted in the outer case 2100 via the bonding member 2200. The outer shape of the outer case 2100 is a rectangular parallelepiped having a substantially square planar shape, similarly to the overall shape of the inertial measurement unit 2000. The screw holes 2110 are formed near two vertices along a diagonal line of the square. The outer case 2100 is in the shape of a box, with the sensor module 2300 accommodated inside.

The sensor module 2300 has an inner case 2310 and a substrate 2320. The inner case 2310 is a member supporting the substrate 2320 and has a shape to fit inside the outer case 2100. In the inner case 2310, a recess 2311 for preventing contact with the substrate 2320 and an opening 2312 for exposing a connector 2330, described later, are formed. Such an inner case 2310 is bonded to the outer case 2100 via the bonding member 2200. The substrate 2320 is bonded to a lower surface of the inner case 2310 via an adhesive.

As shown in FIG. 21, components such as the connector 2330, an angular velocity sensor 2340z detecting an angular velocity about the Z-axis, and an acceleration sensor 2350 detecting an acceleration in each of the X-axis, Y-axis, and Z-axis directions, are installed at an upper surface of the substrate 2320. On lateral surfaces of the substrate 2320, an angular velocity sensor 2340x detecting an angular velocity about the X-axis and an angular velocity sensor 2340y detecting an angular velocity about the Y-axis are installed. The inertial sensor according to the present disclosure can be used as the acceleration sensor 2350.

A control IC 2360 is installed at a lower surface of the substrate 2320. The control IC 2360 is an MCU (micro controller unit) and controls each part of the inertial measurement unit 2000. In a storage unit, a program prescribing an order and content for detecting an acceleration and an angular velocity, a program for digitizing and incorporating detection data into packet data, and accompanying data and the like are stored. In addition, a plurality of other electronic components are installed at the substrate 2320.

Twelfth Embodiment

Figure 22:
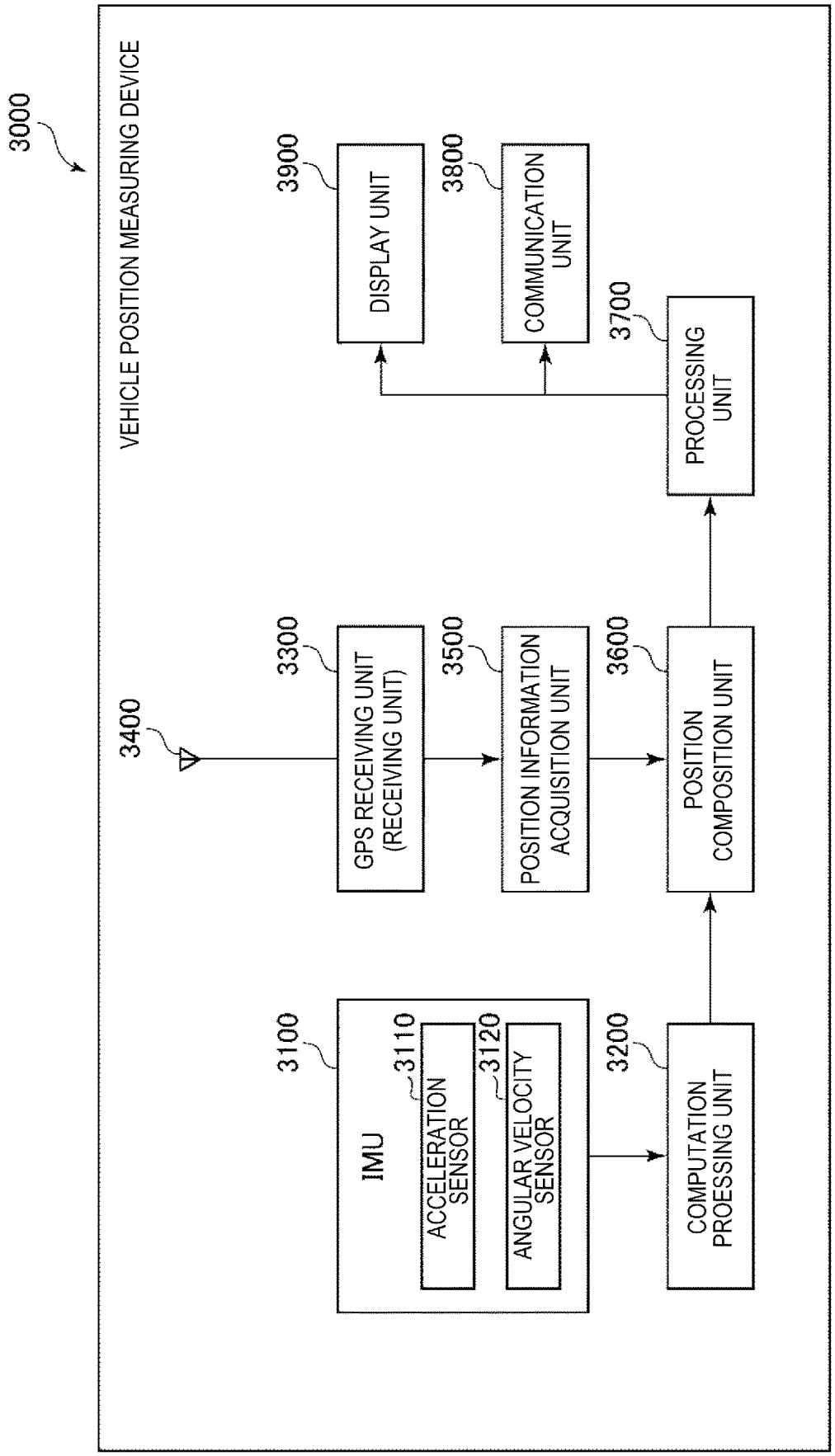
FIG. 22 is a block diagram showing an overall system of a vehicle position measuring device as an electronic apparatus according to a twelfth embodiment.
Figure 23:
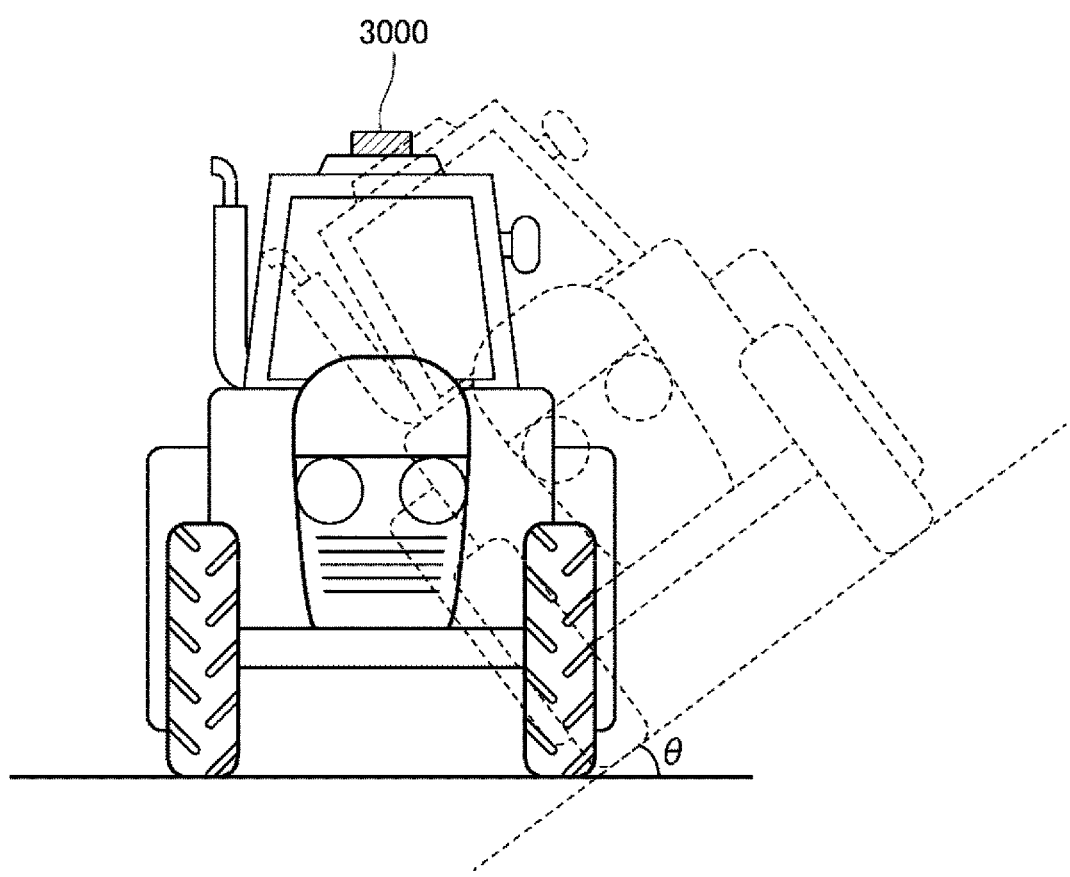
FIG. 23 shows an operation of the vehicle position measuring device shown in FIG. 22.

FIG. 22 is a block diagram showing an overall system of a vehicle position measuring device as an electronic apparatus according to a twelfth embodiment. FIG. 23 shows an operation of the vehicle position measuring device shown in FIG. 22.

A vehicle position measuring device 3000 shown in FIG. 22 is a device installed and used on a vehicle in order to measure the position of the vehicle. The vehicle is not particularly limited and may be any of a bicycle, automobile motorcycle, train, airplane, ship, and the like. In this embodiment, the case where a four-wheeled automobile, particularly an agricultural tractor, is used as the vehicle is described.

The vehicle position measuring device 3000 has an inertial measurement unit 3100 (IMU), a computation processing unit 3200, a GPS receiving unit 3300, a receiving antenna 3400, a position information acquisition unit 3500, a position composition unit 3600, a processing unit 3700, a communication unit 3800, and a display unit 3900. As the inertial measurement unit 3100, for example, the foregoing inertial measurement unit 2000 can be used.

The inertial measurement unit 3100 has an acceleration sensor 3110 for three axes and an angular velocity sensor 3120 for three axes. The computation processing unit 3200 receives acceleration data from the acceleration sensor 3110 and angular velocity data from the angular velocity sensor 3120, carries out inertial navigation processing on these data, and outputs inertial navigation positioning data including the acceleration and attitude of the vehicle.

The GPS receiving unit 3300 receives a signal from a GPS satellite via the receiving antenna 3400. The position information acquisition unit 3500 outputs GPS positioning data representing the position (latitude, longitude, altitude), velocity, and direction of the vehicle position measuring device 3000, based on the signal received by the GPS receiving unit 3300. The GPS positioning data also includes status data representing the receiving state, the time of reception, and the like.

The position composition unit 3600 calculates the position of the vehicle, specifically, which position on the ground the vehicle is travelling at, based on the inertial navigation positioning data outputted from the computation processing unit 3200 and the GPS positioning data outputted from the position information acquisition unit 3500. For example, even when the position of the vehicle included in the GPS positioning data is the same, if the attitude of the vehicle is different due to the influence of the slope 6 or the like on the ground, as shown in FIG. 23, the vehicle is regarded as traveling at a different position on the ground. Therefore, the accurate position of the vehicle cannot be calculated, simply based on the GPS positioning data. Thus, the position composition unit 3600 calculates which position on the ground the vehicle is traveling at, using the inertial navigation positioning data.

The position data outputted from the position composition unit 3600 is processed in a predetermined manner by the processing unit 3700 and the processed position data is displayed as the result of position measurement at the display unit 3900. The position data may also be transmitted to an external device by the communication unit 3800.

Thirteenth Embodiment

Figure 24:
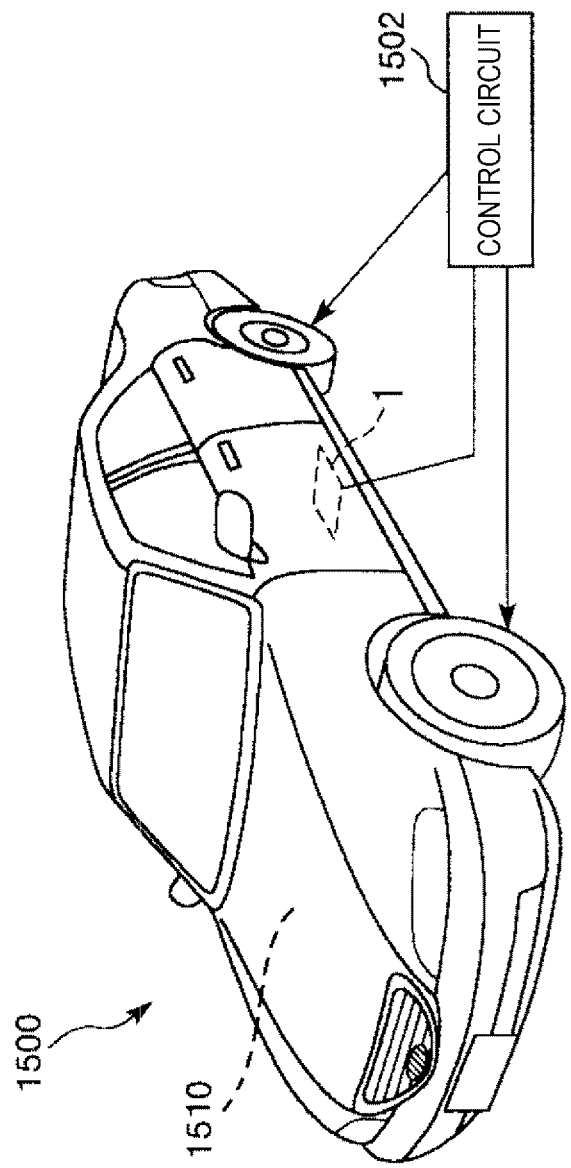
FIG. 24 is a perspective view showing a vehicle according to a thirteenth embodiment.

FIG. 24 is a perspective view showing a vehicle according to a thirteenth embodiment.

An automobile 1500 shown in FIG. 24 is an automobile to which the vehicle according to the present disclosure is applied. In this illustration, the automobile 1500 includes a system 1510 which is at least one of an engine system, a brake system, and a keyless entry system. The inertial sensor 1 is build in the automobile 1500 and can detect the attitude of the vehicle body. A detection signal from the inertial sensor 1 is supplied to a control circuit 1502. Based on the signal, the control circuit 1502 can control the system 1510.

In this way, the automobile 1500 as a vehicle has the inertial sensor 1 and the control circuit 1502 performing control based on a detection signal outputted from the inertial sensor 1. Therefore, the automobile 1500 can have the effects of the inertial sensor 1 and achieve high reliability.

The inertial sensor 1 can also be broadly applied to a car navigation system, car air-conditioning, anti-lock braking system (ABS), airbags, tire pressure monitoring system (TPMS), and electronic control unit (ECU) such as battery monitor for hybrid car or electric vehicle. The vehicle is not limited to the automobile 1500. For example, a railway train, airplane, helicopter, rocket, artificial satellite, ship, AGV (automated guided vehicle), elevator, escalator, bipedal robot, unmanned aircraft such as drone, radio-controlled model, model train, toy or the like can be employed.

The inertial sensor, the electronic apparatus, and the vehicle according to the present disclosure have been described above, based on the illustrated embodiments. However, the present disclosure is not limited to these embodiments. The configuration of each part can be replaced by any configuration having a similar function. Also, any other component may be added to the present disclosure. Moreover, the foregoing embodiments may be suitably combined together.

What is claimed is:
1. An inertial sensor comprising:
a substrate;
a moving element swinging about a swing axis along a Y-axis;
a detection electrode provided at the substrate, overlapping the moving element as viewed in a plan view from a Z-axis direction orthogonal to the Y-axis, and forming an electrostatic capacitance with the moving element;
an exposure part provided at an inner side of the detection electrode as viewed in a plan view from the Z-axis direction and exposing a surface facing the moving element, of the substrate;
a protrusion overlapping the moving element as viewed in a plan view from the Z-axis direction and protruding toward the moving element from the exposure part of the substrate;
a covered electrode provided at a top of the protrusion and having a same electric potential as the moving element;
a dummy electrode provided at the substrate, overlapping an area of the moving element not overlapping the detection electrode as viewed in a plan view from the Z-axis direction, and having a same electric potential as the moving element; and
a coupling wiring provided at the exposure part and coupling the dummy electrode and the covered electrode together.

2. The inertial sensor according to claim 1, wherein the exposure part is open to an outer edge of the detection electrode.

3. The inertial sensor according to claim 2, wherein the detection electrode is provided between the dummy electrode and the swing axis as viewed in a plan view from the Z-axis direction, and
the exposure part is open to the outer edge at the dummy electrode side of the detection electrode.

4. The inertial sensor according to claim 2, wherein the dummy electrode is provided between the detection electrode and the swing axis as viewed in a plan view from the Z-axis direction, and
the exposure part is open to the outer edge at the dummy electrode side of the detection electrode.

5. The inertial sensor according to claim 2, wherein the exposure part is open to the outer edge at one side of the Y-axis direction of the detection electrode.

6. An inertial sensor comprising:
a substrate;
a moving element swinging about a swing axis along a Y-axis;
a detection electrode provided at the substrate, overlapping the moving element as viewed in a plan view from a Z-axis direction orthogonal to the Y-axis, and forming an electrostatic capacitance with the moving element;
an exposure part provided at an inner side of the detection electrode as viewed in a plan view from the Z-axis direction and exposing a surface facing the moving element, of the substrate;
a protrusion overlapping the moving element as viewed in a plan view from the Z-axis direction and protruding toward the moving element from the exposure part of the substrate;
a covered electrode provided at a top of the protrusion and having a same electric potential as the moving element; and
a dummy electrode provided at the substrate, overlapping an area of the moving element not overlapping the detection electrode as viewed in a plan view from the Z-axis direction, and having a same electric potential as the moving element,
wherein the exposure part has a closed shape that is not open to the outer edge of the detection electrode, and
the inertial sensor further comprises a coupling wiring provided inside the substrate and coupling the dummy electrode and the covered electrode together.

7. An inertial sensor comprising:
a substrate;
a moving element swinging about a swing axis along a Y-axis;
a detection electrode provided at the substrate, overlapping the moving element as viewed in a plan view from a Z-axis direction orthogonal to the Y-axis, and forming an electrostatic capacitance with the moving element;
an exposure part provided at an inner side of the detection electrode as viewed in a plan view from the Z-axis direction and exposing a surface facing the moving element, of the substrate;
a covered electrode provided at the exposure part and having a same electric potential as the moving element;
a protrusion overlapping the covered electrode as viewed in a plan view from the Z-axis direction and protruding toward the covered electrode from the moving element;

a dummy electrode provided at the substrate, overlapping an area of the moving element not overlapping the detection electrode as viewed in a plan view from the Z-axis direction, and having a same electric potential as the moving element; and
a coupling wiring provided at the exposure part and coupling the dummy electrode and the covered electrode together.

8. An electronic apparatus comprising:
the inertial sensor according to claim 1; and
a control circuit performing control based on a detection signal outputted from the inertial sensor.

9. A vehicle comprising:
the inertial sensor according to claim 1; and
a control circuit performing control based on a detection signal outputted from the inertial sensor.

* * * * *